United States Patent
Yu et al.

(10) Patent No.: US 10,673,411 B2
(45) Date of Patent: Jun. 2, 2020

(54) LARGE-SIGNAL GM3 CANCELLATION TECHNIQUE FOR HIGHLY-LINEAR ACTIVE MIXERS

(71) Applicant: QUALCOMM Incorporated, San Diego, CA (US)

(72) Inventors: Xinmin Yu, San Diego, CA (US); Lai Kan Leung, San Marcos, CA (US); Yunfei Feng, San Diego, CA (US); Chirag Dipak Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/256,733

(22) Filed: Jan. 24, 2019

(65) Prior Publication Data

US 2019/0238117 A1 Aug. 1, 2019

Related U.S. Application Data

(60) Provisional application No. 62/623,898, filed on Jan. 30, 2018.

(51) Int. Cl.
*H03H 11/04* (2006.01)
*H03D 7/14* (2006.01)
(Continued)

(52) U.S. Cl.
CPC ....... *H03H 11/0422* (2013.01); *H03D 7/1441* (2013.01); *H03D 7/1458* (2013.01);
(Continued)

(58) Field of Classification Search
CPC ...... H03H 1/0422; H04B 1/0096; H04B 1/28; H04B 1/16; H04B 2001/0491; H04B 1/40; H03D 7/1458; H03D 7/1441; H03D 2200/0023; H03D 2200/0088; H03D 2200/0043
(Continued)

(56) References Cited

U.S. PATENT DOCUMENTS

2002/0193089 A1* 12/2002 Hatcher ............... H03D 7/1425
455/326
2009/0174460 A1 7/2009 Chan et al.
2014/0273905 A1 9/2014 Manku et al.

OTHER PUBLICATIONS

International Search Report and Written Opinion—PCT/US2019/015166—ISA/EPO—dated May 14, 2019.
(Continued)

*Primary Examiner* — John W Poos
(74) *Attorney, Agent, or Firm* — Michael R. Harris

(57) ABSTRACT

The present disclosure provides an apparatus that includes a first mixer circuit configured to convert between an RF signal and an IF signal based at least in part on an local oscillator (LO) signal. The first mixer circuit is electrically coupled to a first node that is configured to receive the LO signal and a first bias voltage, a second node that is configured to receive the RF signal or the IF signal, and a third node that is configured to provide the IF signal or the RF signal. The apparatus further includes a second mixer circuit electrically coupled to a fourth node configured to receive the LO signal and a second bias voltage, the second node, and the third node. The second bias voltage has a voltage level that is offset from the first bias voltage.

32 Claims, 14 Drawing Sheets

(51) Int. Cl.
    *H04B 1/40*    (2015.01)
    *H04B 1/28*    (2006.01)
    *H04B 1/00*    (2006.01)
    *H04B 1/16*    (2006.01)
    *H04B 1/04*    (2006.01)
(52) U.S. Cl.
    CPC ............ *H04B 1/0096* (2013.01); *H04B 1/16* (2013.01); *H04B 1/28* (2013.01); *H04B 1/40* (2013.01); *H03D 2200/0023* (2013.01); *H03D 2200/0043* (2013.01); *H03D 2200/0088* (2013.01); *H04B 2001/0491* (2013.01)
(58) Field of Classification Search
    USPC .............................................. 327/63, 64, 65
    See application file for complete search history.

(56) References Cited

OTHER PUBLICATIONS

Kim M-G., et al., "Anaysis and Design of Linearity Improved mixer using Third-Order Transconductance Cancellation", Network Infrastructure and Digital Content (IC-NIDC), 2012 3rd IEEE International Conference on, IEEE, Sep. 21, 2012 (Sep. 21, 2012), XP032314659, DOI: 10.1109/ICNIDC.2012.6418836, ISBN: 978-1-46 73-2201 -0, pp. 652-655, section 2 and 3.

\* cited by examiner

LARGE-SIGNAL GM3 CANCELLATION TECHNIQUE FOR HIGHLY-LINEAR ACTIVE MIXERS

CLAIM OF PRIORITY UNDER 35 U.S.C. § 119

The present Application for Patent claims priority to Provisional Application No. 62/623,898 entitled "LARGE-SIGNAL GM3 CANCELLATION TECHNIQUE FOR HIGHLY-LINEAR ACTIVE MIXERS" filed Jan. 30, 2018 and assigned to the assignee hereof and hereby expressly incorporated by reference herein in its entirety.

FIELD

The present disclosure relates generally to wireless communication, and particularly for active mixer circuits for enhanced broadband operation.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless communication devices, such as a UE or base station, include one or more mixers. A mixer is a non-linear circuit that may be used to shift a signal from one frequency to another for transmission or signal processing. A mixer is a 3-port electronic circuit, where two of the ports are "input" ports and the other port is an "output" port. The mixer mixes the two input signals such that a frequency of the output signal is either the sum (or difference) of the frequencies of the input signals. A mixer may be used to upconvert signals to radio frequencies for transmission, and downconvert received signals from radio frequencies to lower frequencies for processing. Mixers with high linearity that may operate in high frequency ranges such as millimeter wave (mm-wave) frequencies are desirable.

SUMMARY

In one aspect of the disclosure, an apparatus for wireless communications is provided. The apparatus includes a first mixer circuit configured to convert between a radio frequency signal and an intermediate frequency signal based at least in part on a local oscillator signal. The first mixer circuit is electrically coupled to a first node that is configured to receive a first bias voltage and a first local oscillator signal that is based on the local oscillator signal. The first mixer circuit is further electrically coupled to a second node that is configured to receive the radio frequency signal or the intermediate frequency signal. The first mixer circuit is further electrically coupled to a third node that is configured to provide the intermediate frequency signal or the radio frequency signal. The apparatus further includes a second mixer circuit configured to convert between the radio frequency signal and the intermediate frequency signal based at least in part on the local oscillator signal. The second mixer circuit is electrically coupled to a fourth node configured to receive a second bias voltage and a second local oscillator signal that is based on the local oscillator signal. The second bias voltage has a voltage level that is offset from the first bias voltage. The second mixer circuit is further electrically coupled to the second node that is configured to receive the radio frequency signal or the intermediate frequency signal. The second mixer circuit is further electrically coupled to the third node that is configured to provide the intermediate frequency signal or the radio frequency signal.

In another aspect of the disclosure, an active mixer circuit is provided. The active mixer circuit includes a first switching device connected in parallel with a second switching device, each of the first switching device and the second switching device controlled by a local oscillator signal. The first switching device is configured to be biased by an amount that is non-zero and offset from a bias amount of the second switching device that at least partially cancels a third order transconductance (gm3) of the second switching device.

In yet another aspect of the disclosure, an apparatus for wireless communications is provided. The apparatus includes a first transistor configured to convert between a radio frequency signal and an intermediate frequency signal based at least in part on a local oscillator signal. The first transistor has a first gate terminal electrically coupled to a first node that is configured to receive a first local oscillator signal based on the local oscillator signal and a first bias voltage. The first transistor further has a first source terminal electrically coupled to a second node that is configured to receive the radio frequency signal or the intermediate frequency signal. The first transistor further has a first drain terminal electrically coupled to a third node that is configured to provide the intermediate frequency signal or the radio frequency signal. The apparatus further includes a second transistor configured to convert between the radio frequency signal and the intermediate frequency signal based at least in part on the local oscillator signal. The second transistor has a second gate terminal electrically coupled to a fourth node configured to receive a second local oscillator signal based on the local oscillator signal and a second bias voltage. The second bias voltage has a voltage level that is offset from the first bias voltage. The second transistor further has a second source terminal electrically coupled to the second node that is configured to receive the radio frequency signal or the intermediate frequency signal. The second transistor further has a second drain terminal electrically coupled to the third node that is configured to provide the intermediate frequency signal or the radio frequency signal.

In yet another aspect of the disclosure, a method for converting between a radio frequency signal and an intermediate frequency signal based at least in part on a local oscillator signal is provided. The method includes applying a first bias voltage and a first local oscillator signal based on the local oscillator signal to a first gate terminal of a first transistor having a first source terminal electrically coupled to the radio frequency signal and a first drain terminal electrically coupled to the intermediate frequency signal. The method further includes applying a second bias voltage and a second local oscillator signal based on the local oscillator signal to a second gate terminal of a second transistor having a second source terminal electrically coupled to the radio frequency signal and a second drain terminal electrically coupled to the intermediate frequency signal. The second bias voltage has a voltage level that is offset from the first bias voltage.

In yet another aspect of the disclosure, a method for converting between a radio frequency signal and an intermediate frequency signal based at least in part on a local oscillator signal is provided. The method includes applying a first bias voltage and a first local oscillator signal based on the local oscillator signal to a first node electrically coupled to a first mixer circuit, the first mixer circuit having a second node electrically coupled to the radio frequency signal and a third node electrically coupled to the intermediate frequency signal. The method further includes applying a second bias voltage and a second local oscillator signal based on the local oscillator signal to a fourth node electrically coupled to a second mixer circuit, the second mixer circuit electrically coupled to the second node and the third node, the second bias voltage having a voltage level that is offset from the first bias voltage.

In yet another aspect of the disclosure, an apparatus for wireless communications is provided. The apparatus includes a first mixer circuit configured to convert between a radio frequency signal and an intermediate frequency signal based at least in part on a local oscillator signal. The first mixer circuit electrically coupled to a first node that is configured to receive a first local oscillator signal that is based on the local oscillator signal and a first bias voltage, a second node that is configured to receive or provide the radio frequency signal or the intermediate frequency signal, and a third node that is configured to receive or provide the intermediate frequency signal or the radio frequency signal. The apparatus further includes a second mixer circuit configured to convert between the radio frequency signal and the intermediate frequency signal based at least in part on the local oscillator signal. The second mixer circuit is electrically coupled to a fourth node configured to receive a second local oscillator signal that is based on the local oscillator signal and a second bias voltage. The second bias voltage has a voltage level that is offset from the first bias voltage. The second mixer circuit is further electrically coupled to the second node and the third node.

In yet another aspect, an apparatus for wireless communications is provided. The apparatus includes first means for converting between a radio frequency signal and an intermediate frequency signal based at least in part on a local oscillator signal. The first converting means is electrically coupled to a first node that is configured to receive a first bias voltage and a first local oscillator signal that is based on the local oscillator signal. The first converting means is electrically coupled to a second node that is configured to receive the radio frequency signal or the intermediate frequency signal. The first converting means is electrically coupled to a third node that is configured to provide the intermediate frequency signal or the radio frequency signal. The apparatus further comprises second means for converting between the radio frequency signal and the intermediate frequency signal based at least in part on the local oscillator signal. The second converting means is electrically coupled to a fourth node configured to receive a second bias voltage and a second local oscillator signal that is based on the local oscillator signal, the second bias voltage having a voltage level that is offset from the first bias voltage. The second converting means is electrically coupled to the second node that is configured to receive the radio frequency signal or the intermediate frequency signal. The second converting means is electrically coupled to the third node that is configured to provide the intermediate frequency signal or the radio frequency signal.

DETAILED DESCRIPTION

Figure 1:
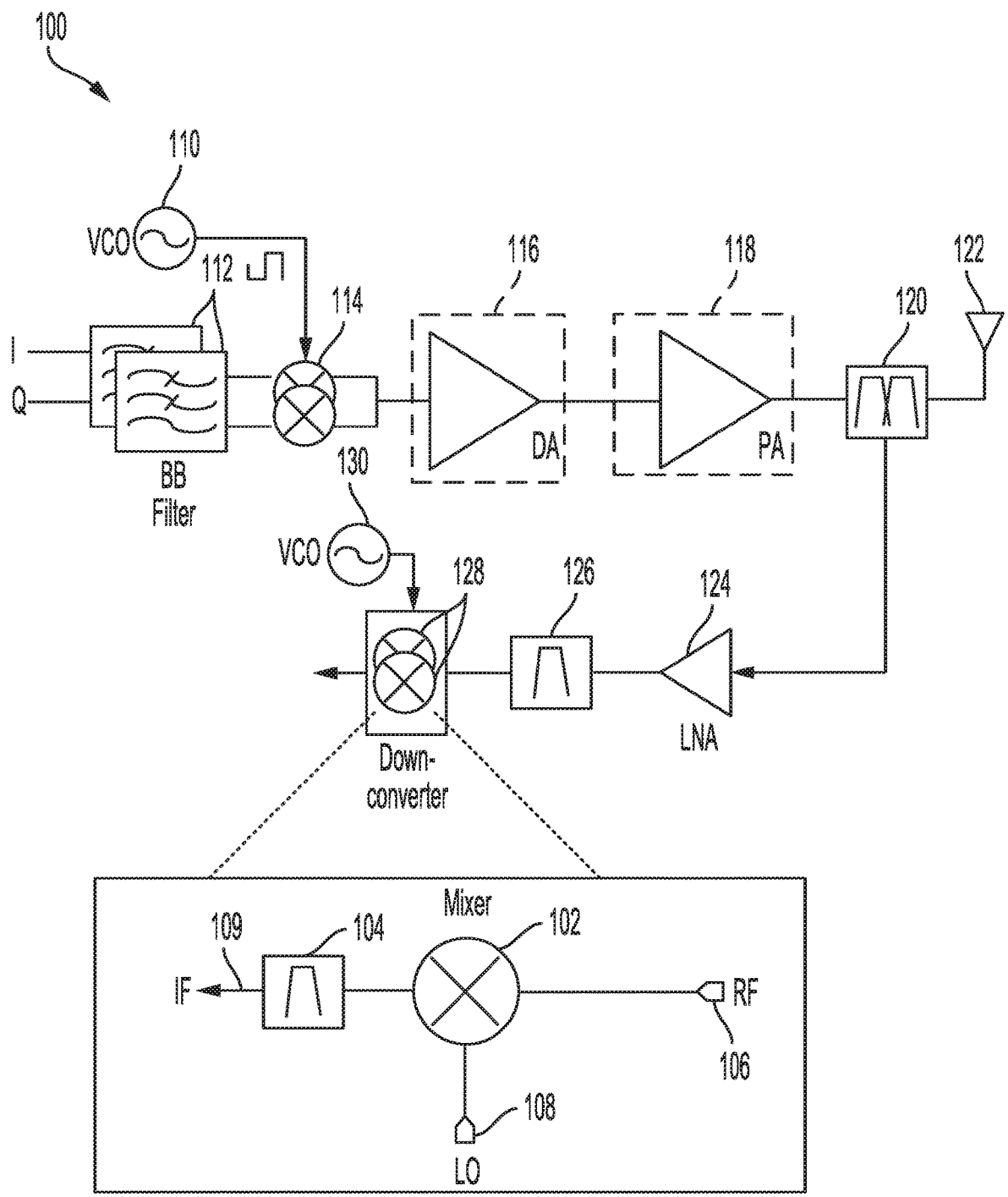
FIG. 1 is a functional block diagram of at least a portion of an example of a simplified wireless transceiver circuit.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Mobile radio frequency (RF) designs (e.g., mobile RF transceivers) have migrated to deep sub-micron process nodes due to cost and power consumption considerations. The design complexity of mobile RF transceivers is further complicated by added circuit function to support communication enhancements. Some of these enhancements involve using mmWave frequency ranges (e.g., around 30 GHz) for higher bandwidth that lead to other design challenges for mobile RF transceivers including analog/RF performance considerations.

FIG. 1 is a functional block diagram of at least a portion of an example of a simplified wireless transceiver circuit 100. The transceiver circuit 100 is configured to receive signals/information for transmission (shown as I and Q values) which is provided to one or more base band filters 112. The filtered output is provided to one or more mixers 114 controlled by a voltage-controlled oscillator (VCO) 110. The output from the one or more mixers 114 is provided to a driver amplifier 116 whose output is provided to a power amplifier 118 to produce an amplified signal for transmission. The amplified signal is output to the antenna 122 through one or more filters 120 (e.g., duplexers if used as a frequency division duplex transceiver or other filters). The antenna 122 may be used for both wirelessly transmitting and receiving data. The transceiver circuit 100 includes a receive path through the one or more filters 120 to be provided to a low noise amplifier (LNA) 124 and a further filter 126 and then down-converted from the receive frequency to a baseband frequency through one or more mixer circuits 128 (controlled by a VCO 130) before the signal is further processed (e.g., provided to an analog digital converter and then demodulated or otherwise processed in the digital domain).

A simplified example of a mixer circuit 102 that may form any of the mixer circuits 128 or 114 is also illustrated. The mixer circuit 102, when performing down-conversion, is configured to receive a radio frequency signal 106 (RF signal) as an input. The mixer circuit 102 further is configured to receive a local oscillator signal 108 (LO signal) as another input. The LO signal 108 may be an alternating current (AC) waveform, such as a sine wave, oscillating at a particular frequency. An oscillator circuit, such as a voltage-controlled oscillator (VCO), voltage-controlled crystal oscillator (VCXO), or phase-locked loop (PLL) may be used to generate the LO signal 108. At higher frequencies such as mm-wave frequencies, the oscillator circuit may employ low voltage swing logic circuits such as current mode logic (CML).

The mixer circuit 102 is configured to mix the LO signal 108 with the RF signal 106 such that a frequency of the intermediate frequency signal 109 at the output is either the sum (or difference) of the frequencies of the input signals. A filter circuit 104 may be included to provide the signal at the frequency of interest. If performing down-conversion (as shown), the received RF signal 106 is converted to a lower frequency for processing. If performing up-conversion, an intermediate frequency signal 109 is the input and the mixer circuit 102 produces an RF signal 106 for transmission (e.g., at higher frequencies) via the antenna 122. The mixer circuit 102 may be an active circuit or a passive circuit. If implemented as an active circuit, the mixer circuit 102 may be further electrically coupled to a power supply (e.g., to a supply voltage if an amplifying device (such as a transistor) is used to control the output signal). The mixer circuit 102 may be implemented with a variety of mixing elements or components, such as one or more transistors or other switching devices or as other mixing elements capable of combining signals at two different frequencies and producing a signal that is a sum or difference of the two different frequencies. The term electrically coupled as described herein includes at least two elements being electrically connected (in some instances intervening elements could be connected between two elements that are electrically coupled or electrically connected).

Operating at high frequencies, such as millimeter wave (mm-wave) frequencies, may constrain the type of mixer that is to be used. Generating a square-wave local oscillator (LO) signal 108 having a high swing to drive a passive mixer may consume significant power at mm-wave frequencies. As such, certain implementations described herein involve active mixers that can tolerate a low-swing sinusoidal LO signal waveform and provide acceptable performance for broadband operation. In implementations described herein, the peak-to-peak amplitude (e.g., the signal swing) may vary based on the frequency of the local oscillator signal. The frequency of the LO signal 108 may be dynamically changed in order to convert the RF signal 106 to an intermediate frequency signal 109 at different frequencies depending on the current frequency band being used. When the LO signal 108 has a lower frequency, the LO signal 108 may have a first peak to peak amplitude that is higher than a second peak to peak amplitude when the LO signal 108 is at a higher frequency (for different target output frequencies).

In certain mixer circuit implementations, the LO signal 108 may be used to control a transistor or other component that has a non-linear third order transconductance (gm3). As just described, if the LO signal peak-to-peak amplitude varies over a significant range, then the gm3 over this range may also vary and reduces the linearity of the mixer circuit. This is more particularly described with reference to two example mixer circuit implementations in FIGS. 2A and 2B.

Figure 2A:
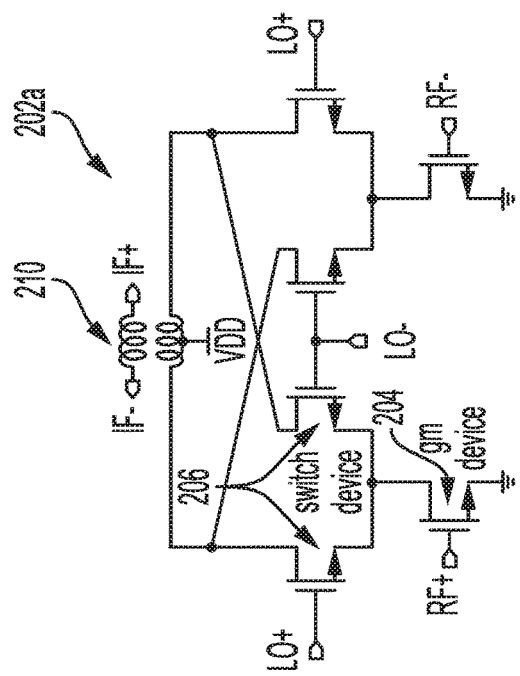
FIG. 2A is a schematic diagram of an example of an active mixer circuit configured as a double balanced Gilbert mixer circuit.

FIG. 2A is a schematic diagram of an example of an active mixer circuit 202a based on a double balanced Gilbert mixer design. The active mixer circuit 202a of FIG. 2A includes two switch devices 206 (e.g., transistors) along with a transconductance (gm) device 204 (e.g., transistor) electrically coupled to each switch device 206. A radio frequency (RF) signal may be input at a gate of the gm device 204. The switch devices 206 and the gm device 204 may include one or more metal-oxide semiconductor field-effect transistors (MOSFETs). The gm device 204 may be electrically coupled to a respective source terminal of each switch device 206. The drain terminals of the switch devices 206 are coupled to a supply voltage Vdd through one side of a transformer 210 that is configured to provide the intermediate frequency IF signal. The gates of the switching devices 206 are coupled to an LO signal. The linearity (IP3) of the active mixer circuit 202a may be constrained by the gm device 204, particularly at mm-wave frequencies, due to third-order transconductance (gm3) effects causing third order intermodulation distortion (IM3).

Figure 2B:
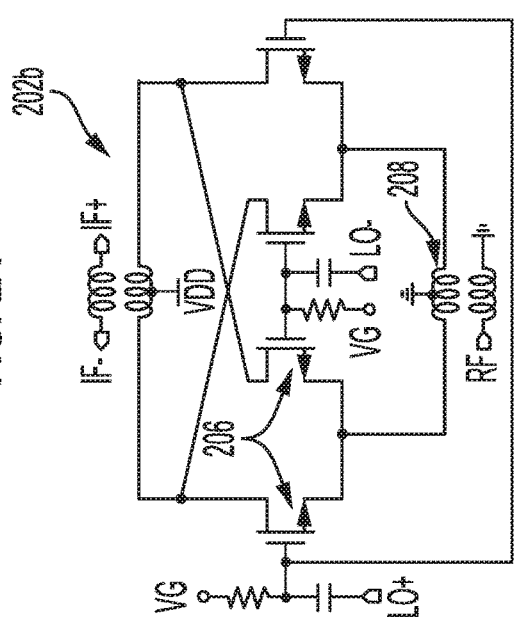
FIG. 2B is a schematic diagram of another example of an active mixer circuit based on a double balanced mixer design with the gm devices removed.

FIG. 2B is a schematic diagram of another example of an active mixer circuit 202b based on a double balanced mixer design with the gm devices removed. As compared to FIG. 2A, the gm device 204 of FIG. 20A is removed and the RF signal is coupled to the source terminals of the switch devices 206 through a transformer 208 having a ground connection on the secondary side (e.g., tied to the source terminals of the switching devices 206 through that side of the transformer 208). This removes the gm3 component from the gm device 204 of FIG. 2A and provides a low impedance path to ground at the source terminals of the switch devices 206 to attenuate low-frequency IM2 components that can impact linearity. However, the switch devices 206 still have a gm3 that varies depending on the gate voltage of the switch devices 206. Since the variation in the range of peak-to-peak amplitude of the LO signal is a large signal, the gm3 of the switch device is also LO-swing dependent. The large variation in amplitude, due to desirability for broadband operation, makes gm3 a significant issue that reduces linearity.

Figure 3:
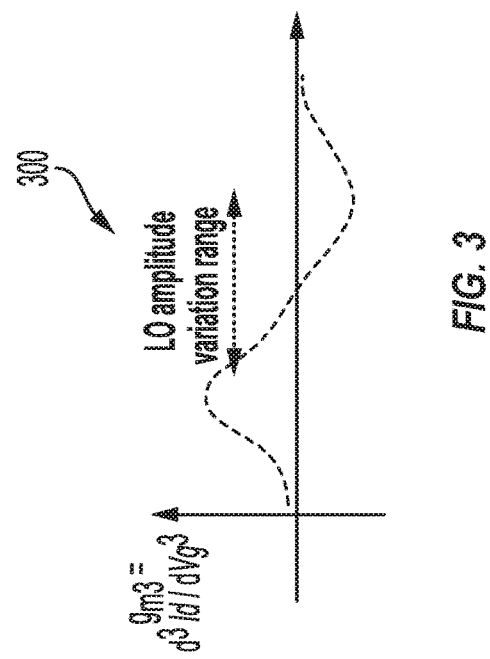
FIG. 3 is a plot of gm3 for one of the switching devices shown in FIG. 2B.

FIG. 3 is a plot 300 of gm3 for one of the switching devices 206 shown in FIG. 2B. The x-axis corresponds to the gate voltage while the y-axis corresponds to the gm3 level. The peak-to-peak amplitude of the LO signal may vary based on the frequency of the LO signal. This range of different peak-to-peak amplitudes over which the LO signal may operate is shown by the 'LO amplitude variation range' label in FIG. 3 and corresponds to a range of gate voltages applied at the gate of each of the switching devices 206. The plot 300 shows that gm3 will vary significantly over the LO amplitude variation range thus substantial causing third order intermodulation at some frequencies which reduces overall linearity. Particularly, the drain current of one of the switching devices 206 can be expressed by the following partial Taylor series:

$$i_{DS} = I_{dc} + g_m v_{gs} + \frac{g_{m2}}{2!} v_{gs}^2 + \frac{g_{m3}}{3!} v_{gs}^3.$$

For ideal linear operation, the gm3 in the equation above would be zero and any reduction in gm3 reduces third order intermodulation (IM3). However, as shown by the plot 300 in FIG. 3, for broadband operation, the gate voltage of the switching device will vary over the LO amplitude variation range which results in significant gm3 variation over that range that causes IM3 and reduces linearity (IP3).

To address this issue, certain implementations described herein are related to cancelling the gm3 component from switch devices controlled by a LO signal over the entire LO range of LO amplitude variation in an active mixer circuit. In an aspect, certain implementations add an auxiliary switching device in parallel with the main switching device (both controlled by the same large signal LO signal) where the auxiliary device is biased in a way to cancel the gm3 component of the main device over the range of LO amplitudes. For example, in some cases, the gate of the auxiliary switching device is biased in a sub-Vt region (e.g., sub-threshold region).

Figure 4:
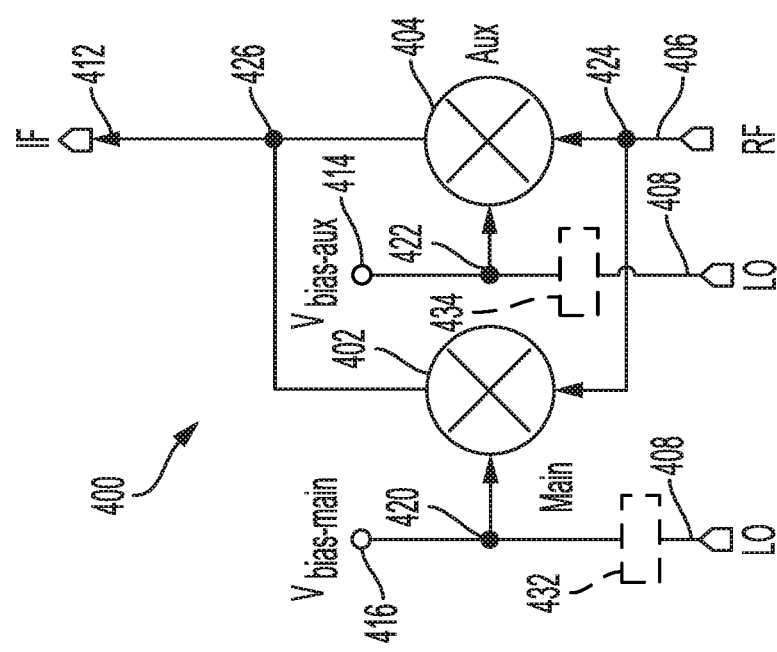
FIG. 4 is a functional diagram of an example of a mixer circuit for gm3 cancellation for mixing elements controlled by a local oscillator signal.

FIG. 4 is a functional diagram of an example of a mixer circuit 400 for gm3 cancellation for mixing elements controlled by a local oscillator signal. The mixer circuit 400 includes a first mixer circuit 402 (e.g., could be just a single mixing element or component or combination of elements) configured to convert between a radio frequency signal 406 (RF signal) and an intermediate frequency signal 412 (IF signal) based at least in part on a local oscillator signal 408 (LO signal). The mixer circuit 400 further includes a second mixer circuit 404 (e.g., could be just a single mixing element or component or combination of elements) configured to convert between the radio frequency signal 406 and the intermediate frequency signal 412 based at least in part on the local oscillator signal 408. The first mixer circuit 402 and the second mixer circuit 404 may include one or more components configured to combine (e.g., multiply, perform mixing function) the local oscillator signal 408 with the radio frequency signal 406 to generate the intermediate frequency signal 412. For example, the mixer circuit 402 may comprise or be the switch devices (e.g., implemented as MOSFETs) as shown by the switch devices 206 in FIGS. 2A and 2B (and as will be further described below). But other mixing devices/components may also be used.

The first mixer circuit 402 is electrically coupled to a first node 420 that is configured to receive a first local oscillator signal based on the local oscillator signal 408 and a first bias voltage 416. Optionally, there may be a first local oscillator signal adjustment circuit 432 configured to adjust the local oscillator signal 408 and output the first local oscillator signal. The first local oscillator signal adjustment circuit 432 may include a capacitor or other circuit elements configured to adjust the local oscillator signal 408. However, in some cases, the first local oscillator signal at node 420 is the same as the local oscillator signal 408. The first mixer circuit 402 is further electrically coupled to a second node 424 that is configured to receive the radio frequency signal 406. The first mixer circuit 402 is further electrically coupled to a third node 426 that is configured to provide the intermediate frequency signal 412. In certain active mixer circuit configurations, the third node 426 may be further electrically coupled to a supply voltage (not shown). For purposes of explanation, the first mixer circuit 402 may be referred to as the main mixer circuit 402 and the first bias voltage 416 may be referred to as the main bias voltage. It should be appreciated that for various mixer configurations in certain implementations the second node 424 is configured to receive the intermediate frequency signal and the third node 425 is configured to provide the radio frequency signal and as such the second node 424 may be configured to receive the radio frequency signal 406 or the intermediate frequency signal 412 and the third node 426 may be configured to provide the intermediate signal 412 or the radio frequency signal.

The second mixer circuit 404 is electrically coupled to a fourth node 422 configured to receive a second local oscillator signal based on the local oscillator signal 408 and a second bias voltage 414. Optionally, there may be a second local oscillator signal adjustment circuit 434 configured to adjust the local oscillator signal 408 and output the second local oscillator signal. The second local oscillator signal adjustment circuit 434 may include a capacitor or other circuit elements configured to adjust the local oscillator signal 408. However, in some cases the second local oscillator signal is the same as the local oscillator signal 408. In some implementations, the second local oscillator adjustment circuit 434 may be present while the first local oscillator signal adjustment circuit 432 may be absent (and vice versa).

The second bias voltage 414 is configured to have a voltage level that is offset from the first bias voltage 416. In certain cases, the offset is by a fixed and pre-determined amount. However, in other cases, the offset can be dynamically changed based on the current frequency band being used etc. As one non-liming example, a value for the first bias voltage could be on the order of ~400 mV while the second bias voltage is on the order of ~200 mV. However, it should be appreciated that the bias voltages are dependent on a variety of factors such as process node, device type used, and the like and therefore these values are provided for illustration only. In general, the second bias voltage 414 is non-zero in the sense that during operation the second bias voltage 414 is not toggled between an on and off state but rather is provided at an offset. In an aspect, the second bias voltage 414 is at an offset where the first bias voltage 416 and the second bias voltage 414 are tied together in the sense that there is a set relationship between the value of the first bias voltage 416 and the value of the second bias voltage 414. The second mixer circuit 404 is further electrically coupled to the second node 424. The second mixer circuit 404 is further electrically coupled to the third node 426. For purposes of explanation, the second mixer circuit 404 may be referred to as the auxiliary mixer circuit 404 and the second bias voltage 414 may be referred to as the auxiliary bias voltage. As shown, the first mixer circuit 402 is in parallel with the second mixer circuit 404.

As described above, in an implementation, the second bias voltage 414 is configured to have a voltage level that is offset from the first bias voltage 416 by a fixed and predetermined amount. The amount of offset between the first bias voltage and the second bias voltage is configured to linearize a third-order transconductance (gm3) of the first mixer circuit 402 over a range of amplitude variation of the local oscillator signal 408 (e.g., in some cases this may correspond to cancellation of the third order transconductance (gm3) of the first mixer circuit 402). As mentioned above, for broadband operation, a frequency of the local oscillator signal is configured to vary based on a current operating frequency and the corresponding a peak to peak amplitude of the local oscillator signal varies based on the frequency (e.g., amplitude is smaller for higher frequencies). The gm3 cancellation, based on the determined offset amount between the first bias voltage 416 and the second bias voltage 414, is configured to be operative at least over the range of amplitude changes of the local oscillator signal.

Figure 5:
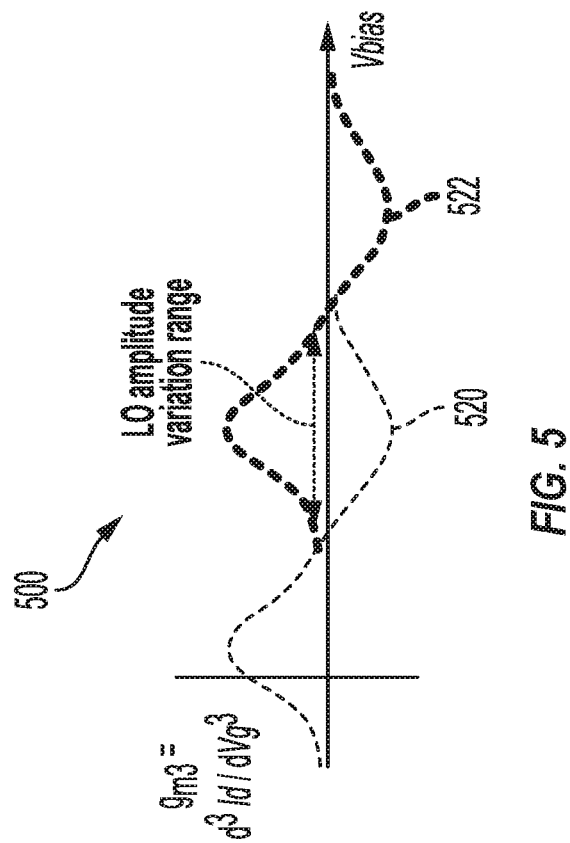
FIG. 5 is a plot of gm3 curves as a function of Vg for the first mixer circuit and the second mixer circuit of FIG. 4.

FIG. 5 is a plot 500 of gm3 curves as a function of the bias voltage (Vbias) for the first mixer circuit 402 and the second mixer circuit 404 of FIG. 4. In this example, the second bias voltage 414 level is selected in the sub Vt region. The plot 500 of FIG. 5 shows the gm3 curve 520 of the first mixer circuit 402 and the gm3 curve 522 of the second mixer circuit 404 as a function of Vg. Due to the different bias points, each curve 520 and 522 is shifted relative to the other by an amount such that portions of the curves 520 and 522 that are relatively inverted relative to the other overlap in the region where the LO amplitude variation occurs (e.g., the peak of the curve 522 generally aligns with the minimum of the other curve 520). In this way, the sum of the gm3 when the signals are combined results in linearization wherein a total overall net gm3 component is substantially constant as a function of Vg (and potentially substantially close to 0) in the region where the LO amplitude variation occurs (or at least relatively flat). Stated another way, there is cancellation of the gm3 component of the first mixer circuit 402 to provide large-signal IM3 reduction over a wide range of LO amplitude variation further improving linearity (as sometimes represented by the third order intercept point (IP3)). In addition, IP3 becomes much less sensitive to LO amplitude variations (a potential issue in wideband mm-wave applications).

It is noted that to supply the first bias voltage 416 and the second bias voltage 414, the mixer circuit 400 may include a first bias circuit (not shown) configured to generate the first bias voltage 416 and a second bias circuit (not shown) configured to generate the second bias voltage 414. An example of the bias circuitry to generate the second bias voltage 414 is described below. Further, one or more components of the first bias circuit and the second bias circuit may be shared.

In addition, there may be a radio frequency signal processing circuit (not shown in FIG. 4) configured to provide or receive the radio frequency signal 406 along with an intermediate frequency signal processing circuit (not shown in FIG. 4) configured to provide or receive the intermediate frequency signal 412.

Figure 6:
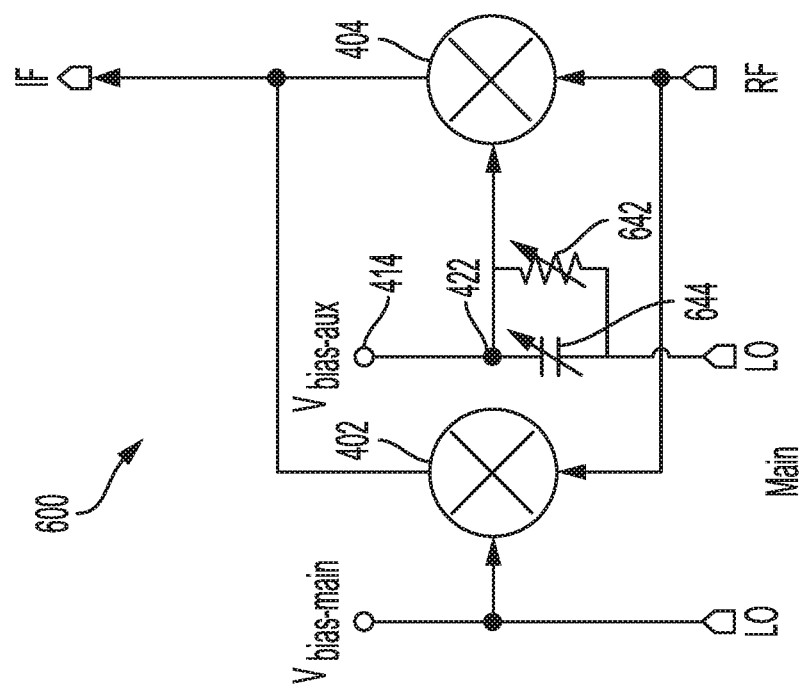
FIG. 6 is a functional diagram of another example of a mixer circuit for gm3 cancellation for mixing elements controlled by a local oscillator signal.

FIG. 6 is a functional diagram of another example of a mixer circuit 600 for gm3 cancellation for mixing elements controlled by a local oscillator signal. The mixer circuit 600 is similar to the mixer circuit 400 of FIG. 4 and further includes an adjustable reactive element 644 (e.g., tunable and the reactive element may be a capacitor or inductor) and an adjustable resistive element 642 (e.g., tunable) electrically each connected to the fourth node 422 that is tied to the second bias voltage 414. The reactive element 644 is electrically coupled in parallel to the resistive element 642. The reactive element 644 and the resistive element 542 are also each electrically coupled to the LO signal. The reactance value of the reactive element 644 and the resistance value of the resistive element 642 are configured to create an RC phase and amplitude tuned to improve the gm3 cancellation. In addition, as described above, the second bias voltage 414 may be dynamically changed based on a particular frequency band to achieve desired level of gm3 cancellation.

Figure 7:
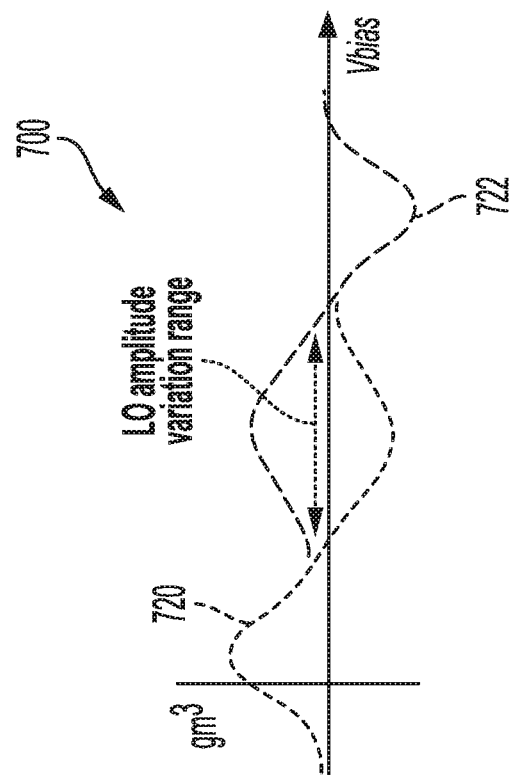
FIG. 7 is a plot that shows adjusted gm3 cancellation curves using the RC phase and amplitude adjustment elements of FIG. 6.

FIG. 7 is a plot 700 that shows adjusted gm3 curves 720 (corresponding to the first mixer circuit 402) and 722 (corresponding to the second mixer circuit 404) using the RC phase and amplitude adjustment elements of FIG. 6. The reactive element 644 and resistive element 642 change the gm3 over various values of Vg and the shape of the gm3 curve 722 is altered relative to plot 500 of FIG. 5B. Particularly, as compared to FIG. 5B, the gm3 curve 722 is generally inverse to curve 720 but is now altered to be more matched in width and relative height (better matched against the width and relative height (e.g., magnitude) of curve 720). The net cancellation is increased over the LO amplitude variation range. As such, the reactive element 644 and the resistive element 624 are configured to shift the phase and amplitude to improve the gm3 cancellation. In an implementation, the reactive element 644 is a variable reactive element 644 and the resistive element 642 is a variable resistive element 642. Any of the adjustable elements or variable elements (adjustable/variable reactive elements or adjustable/variable resistive elements) may be implemented by the way of banks of reactive elements or resistive elements (e.g., capacitor banks or resistor banks) combined with switches to allow selection of different values. Other variable or tuning technologies may also be used (e.g., varactors and the like).

Figure 8B:
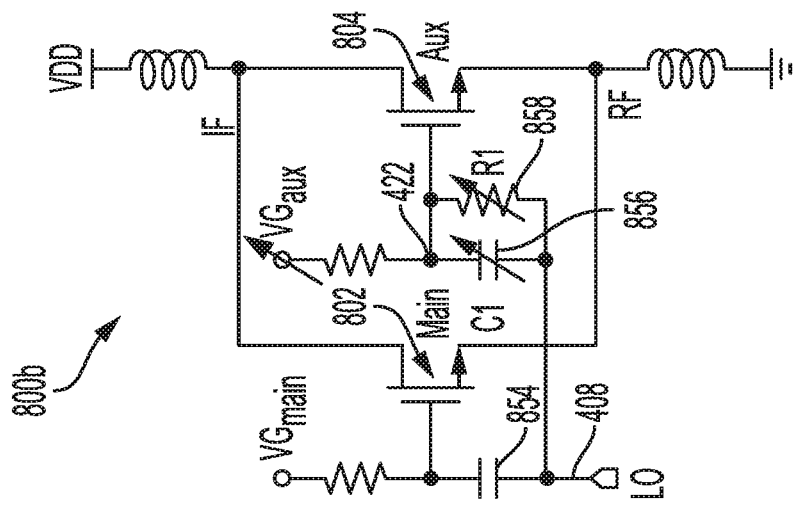
FIG. 8B is a schematic diagram of an example of an implementation of the mixer circuit of FIG. 6.
Figure 8A:
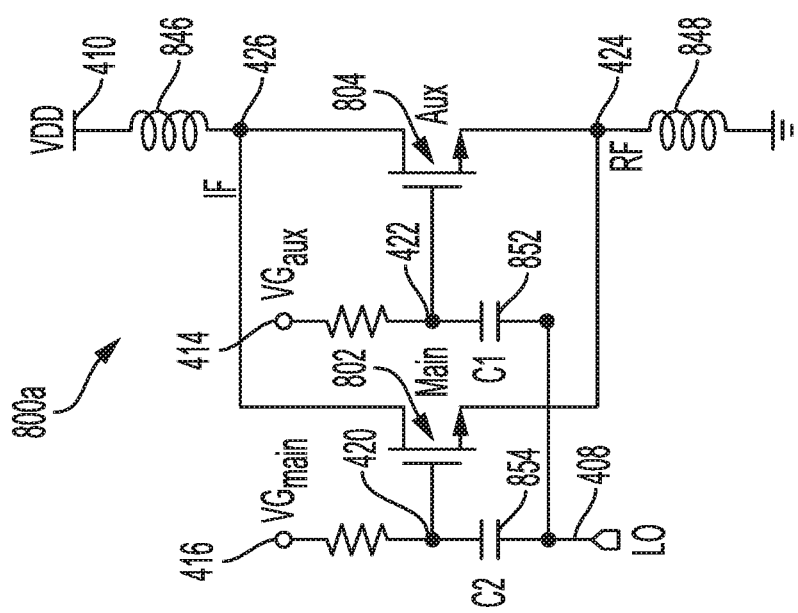
FIG. 8A is a schematic diagram of an example of an implementation of the mixer circuit of FIG. 4.

FIG. 8A is a schematic diagram of an example of an implementation of the mixer circuit 400 of FIG. 4. In the mixer circuit 800a of FIG. 8A, the first mixer circuit 402 of FIG. 4 is implemented as a first transistor 802 (e.g., MOSFET) having a source terminal electrically coupled to the second node 424, a drain terminal electrically coupled to the third node 426, and a gate terminal electrically coupled to the first node 420. The second mixer circuit 404 of FIG. 4 is implemented as a second transistor 804 having a source terminal electrically coupled to the second node 424, a drain terminal electrically coupled to the third node 426, and a gate terminal electrically coupled to the fourth node 422.

The third node 426 is electrically coupled to a supply voltage 410. Depending on the application (e.g., up-conversion versus down-conversion) or choice of transistor type in certain implementations the second node 424 could also be configured to receive the intermediate frequency signal and the third node 426 could be configured to provide the radio frequency signal.

The first transistor 802 and the second transistor 804 in the mixer circuit 800a are implemented as NMOS transistors. In the mixer circuit 800a of FIG. 8A, the second bias voltage 414 is in the sub Vt region of the second transistor 804 or at least lower than the first bias voltage 416.

The mixer circuit 800a of FIG. 8A further includes an inductor 846 electrically coupled between a supply voltage 410 and the third node 426. The intermediate frequency signal may be provided at an output at the third node 426 or in certain implementations, the inductor 846 may form a portion of a transformer configured to provide the intermediate frequency output signal to other signal processing circuitry. Furthermore, the mixer circuit 800a of FIG. 8A includes an inductor 848 electrically coupled to the second node 424. In certain implementations, the inductor 848 forms part of a transformer configured to provide the RF signal to the mixer circuit 800a. In addition, the mixer circuit 800a includes a first capacitor C1 852 and second capacitor C2 854 electrically coupled between the local oscillator signal 408 and the first node 420 and fourth node 422 respectively. The second capacitor C2 854 may be an example of the first local oscillator signal adjustment circuit 432 of FIG. 4 to produce the first local oscillator signal while the first capacitor C1 852 may be an example of the second local oscillator signal adjustment circuit 434 of FIG. 4 to produce the second local oscillator signal. The second (auxiliary) bias voltage 414 is configured to be at a fixed offset from the first (main) bias voltage 416 to cause the gm3 cancellation as described above.

In general, the mixer circuit 800a may therefore include a first switching device (e.g., transistor 802) connected in parallel with a second switching device (e.g., transistor 804) where each of the first switching device and the second switching device controlled by a local oscillator signal 408. The first switching device is configured to be biased by an amount that is offset from a bias amount of the second switching device that cancels a third order transconductance (gm3) of the second switching device.

In addition, in accordance with the mixer circuit 800a of FIG. 8A, a method for converting between a radio frequency signal and an intermediate frequency signal based at least in part on a local oscillator signal 408 is provided. The method includes applying a first bias voltage 416 and a local oscillator signal 408 to a first gate terminal of a first transistor 802 having a first source terminal electrically coupled to the radio frequency signal and a first drain terminal electrically coupled to the intermediate frequency signal. The method may further includes applying a second bias voltage and the local oscillator signal 408 to a second gate terminal of a second transistor 804 having a second source terminal electrically coupled to the radio frequency signal and a second drain terminal electrically coupled to the intermediate frequency signal where the second bias voltage has a voltage level that is offset from the first bias voltage by a certain amount for gm3 cancellation (e.g., may be a fixed and pre-determined amount).

More generally with respect to FIG. 4, a method for converting between a radio frequency signal 406 and an intermediate frequency signal 412 based at least in part on a local oscillator signal 408 is provided. The method includes applying a first bias voltage 416 and a first local oscillator signal based on the local oscillator signal 408 to a first node 420 electrically coupled to a first mixer circuit 402. The first mixer circuit has a second node 424 electrically coupled to the radio frequency signal 406 and a third node 426 electrically coupled to the intermediate frequency signal 412. The method further includes applying a second bias voltage 414 and a second local oscillator signal based on the local oscillator signal to a fourth node 422 electrically coupled to a second mixer circuit 404. The second mixer circuit 404 is electrically coupled to the second node 424 and the third node 426. The second bias voltage 414 has a voltage level that is offset from the first bias voltage 416.

FIG. 8B is a schematic diagram of an example of an implementation of the mixer circuit 600 of FIG. 6. The mixer circuit 800b includes the components of the mixer circuit 800a of FIG. 8A and in addition includes an adjustable capacitor C1 856 and adjustable resistor R1 858 configured to operate similarly as described with reference to FIG. 6. More particularly, the adjustable capacitor C1 856 is electrically coupled to the fourth node 422 that is electrically coupled to the gate terminal of the second transistor 804. The adjustable capacitor C1 856 is also electrically coupled to receive the LO signal 408. The adjustable resistor R1 858 is also connected to the LO signal 408 and to the fourth node 422 such that the adjustable capacitor C1 856 is electrically in connected in parallel to the adjustable resistor R1 858. Adjustment of the reactance (e.g., capacitance) and resistance allows for adjusting the gm3 across a desired range of gate voltage as described with reference to FIGS. 6 and 7 to improve gm3 cancellation.

The mixer circuits 800a and 800b of FIGS. 8A and 8B are implemented with NMOS transistors. The mixer circuits 800a and 800b may also be implemented with PMOS transistors.

Figure 9B:
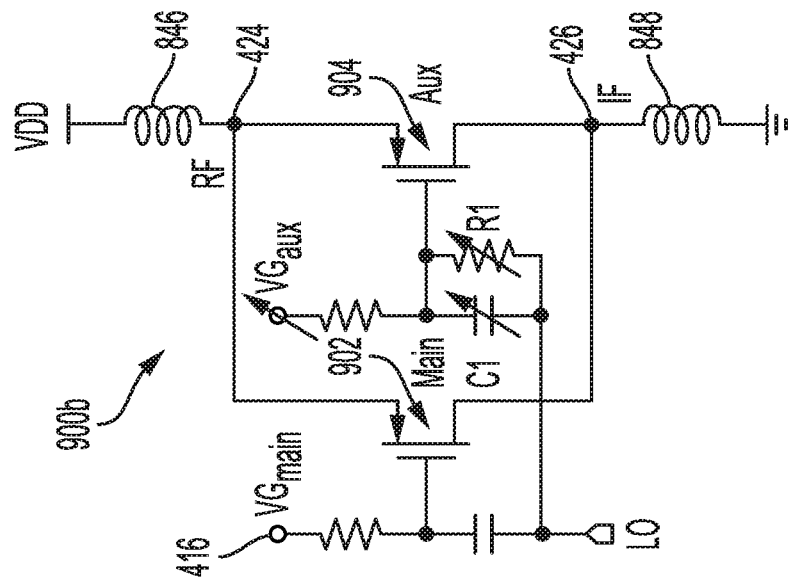
FIGS. 9A and 9B are schematic diagrams of examples of implementations of mixer circuits that are similar to the mixer circuits of FIGS. 8A and 8B but implemented with PMOS transistors.
Figure 9A:
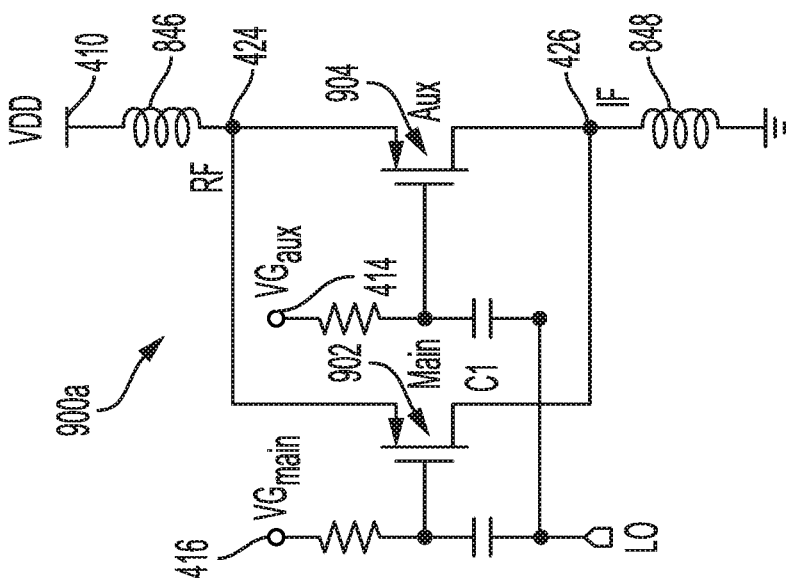

FIGS. 9A and 9B are schematic diagrams of examples of implementations of mixer circuits 900a and 900b that are similar to the mixer circuits 800a and 800b of FIGS. 8A and 8B but implemented with PMOS transistors. As such, in both FIGS. 9A and 9B the first transistor 902 and the second transistor 904 are implemented as PMOS transistors. In this case, the second node 424 is electrically coupled to the supply voltage 410 (e.g., via inductor 846) and is associated with the radio frequency signal. In addition, the third node 426 associated with the intermediate frequency signal is now electrically coupled between an inductor 848 and ground. In this case, the second bias voltage 414 is configured to be higher than the first bias voltage 416. Otherwise, the descriptions related to FIGS. 8A and 8B apply to the mixer circuits 900a and 900b of FIGS. 9A and 9B.

Figure 10A:
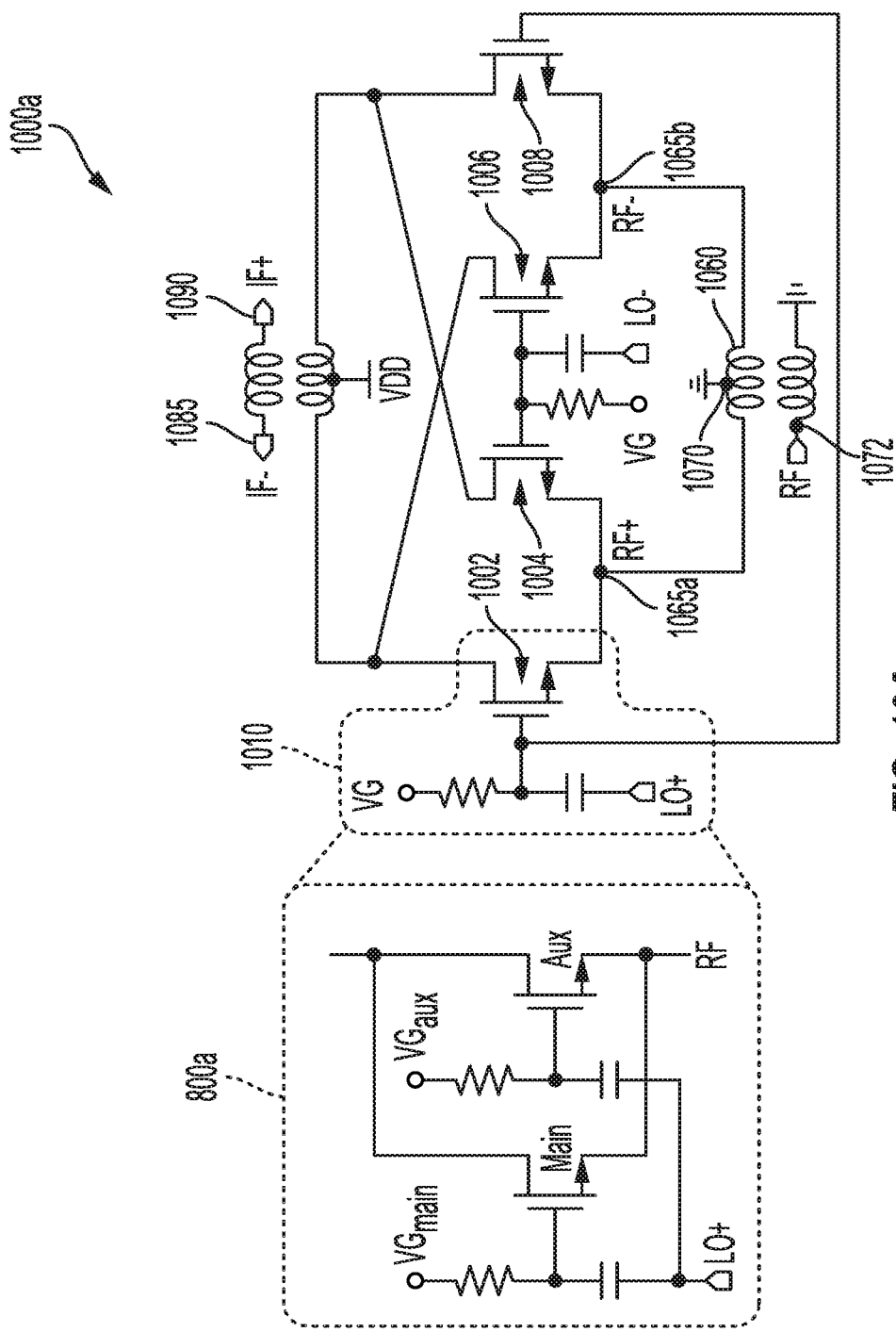
FIG. 10A is a schematic diagram of an example of a mixer circuit that illustrates how the mixer circuit of FIG. 8A may be integrated into an implementation of the double balanced active mixer circuit shown in FIG. 2B.

FIG. 10A is a schematic diagram of an example of a mixer circuit 1000a that illustrates how the mixer circuit 800a of FIG. 8A may be integrated into an implementation of the double balanced active mixer circuit 202b shown in FIG. 2B. The mixer circuitry 1010 that includes the first transistor 1002 (e.g., mixing element) that is controlled by the local oscillator signal is replaced by the mixer circuit 800a denoted by the dotted box to the left of circuitry 1010. As such, the transistor 1002 is replaced by the main and auxiliary transistors as described with references to FIG. 4/8A (and labeled and first and second transistors with respect to the description of FIG. 8A). Furthermore, each of the other second transistor 1004, third transistor 1006, and fourth transistor 1008 (e.g., other mixing elements) may each be replaced by circuitry similar to the mixer circuit 800a so that the gm3 of each of the second transistor 1004, third transistor 1006, and fourth transistor 1008 is additionally cancelled.

More particularly, the mixer circuit 1000a is a double-balanced active mixer arrangement having a transformer 1060 with a node 1072 for an input signal (e.g., a radio frequency signal) such that the differential radio frequency signal RF+(positive signal) and RF− (negative signal) are provided to the first RF differential node 1065a and a second RF differential node 1065b respectively. The mixer circuit 1000a further includes differential nodes 1085 and 1090 configured to provide a differential intermediate frequency signal output IF+ and IF−. The RF signal may be within a mm-wave frequency band in certain implementations. For down conversion, the mixer circuit 1000a may receive an RF input signal at node 1072 and output a down converted signal at nodes 1085 and 1090. For up conversion, the mixer circuit 1000a may receive an intermediate frequency input signal at node 1072 and output an RF signal at nodes 1085 and 1090.

As described above, the first transistor 1002 that is tied to RF+ via the first RF differential node 1065a is replaced by the two transistors (main and auxiliary) of the mixer circuit 800a and as described above. In this case, the gates of the main and auxiliary transistors are tied to the differential LO+ signal. In addition, the second transistor 1004 with source terminal tied to RF+ signal via the first RF differential node 1065a is also replaced by the mixer circuit 800a. However, in this case the gate terminals of each of the main and auxiliary transistors are controlled by the differential LO− signal. The third transistor 1006 with source terminal tied to the RF− signal via the second RF differential node 1065b is also replaced by the mixer circuit 800a. In this case, the gate terminals of each of the main and auxiliary transistors are controlled by the differential LO− signal. In addition, the fourth transistor 1008 with source terminal tied to the RF− signal via the second differential node 1065b is also replaced by the mixer circuit 800a. In this case, the gate terminals of each of the main and auxiliary transistors are controlled by the differential LO+ signal. Transformer 1060 is also coupled to ground at node 1070.

Figure 10B:
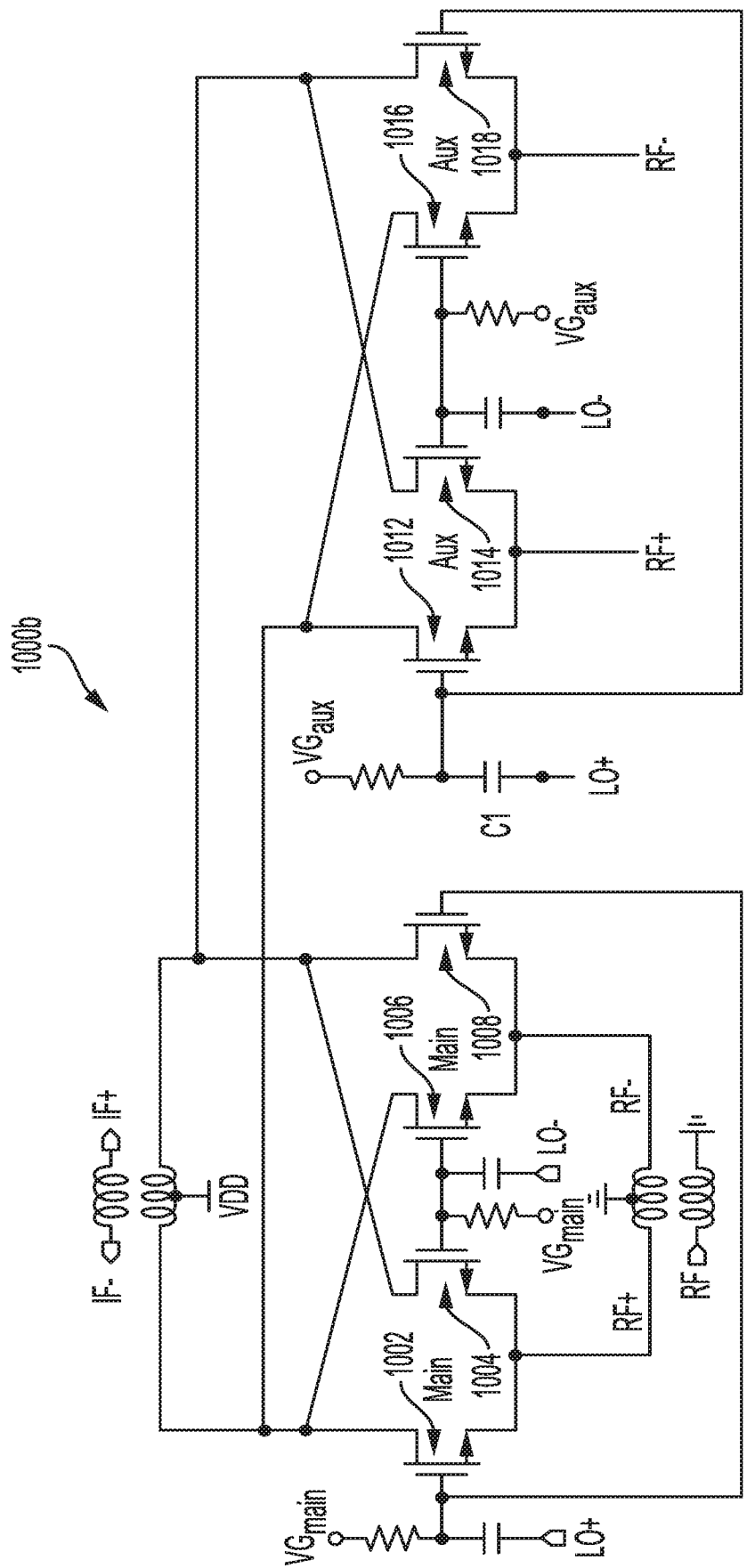
FIG. 10B is a schematic diagram of another example of an active mixer circuit where each of the switching devices incorporate the gm3 cancellation mixer circuit of FIG. 8A.

FIG. 10B is a schematic diagram of another example of an active mixer circuit 1000b where each of the switching devices incorporate the gm3 cancellation mixer circuit 800a of FIG. 8A. The mixer circuit 1000b is a more complete illustration of the mixer circuit 1000a described with reference to FIG. 10A. The mixer circuit 1000b includes the "main" transistors 1002, 1004, 1006, and 1008 along with the "auxiliary" transistors 1012, 1014, 1016, and 1018. Each of the auxiliary transistors 1012, 1014, 1016, and 1018 is biased based on the auxiliary bias signal as described above for gm3 cancellation of each of the main transistors 1002, 1004, 1006, and 1008. Particularly, each of the auxiliary transistors 1012, 1014, 1016, and 1018 is biased at a fixed offset from the bias voltage of the main transistors 1002, 1004, 1006, and 1008 by an amount to cause gm3 cancellation of the gm3 of each of the main transistors 1002, 1004, 1006, and 1008 over the LO amplitude variation range.

Figure 10C:
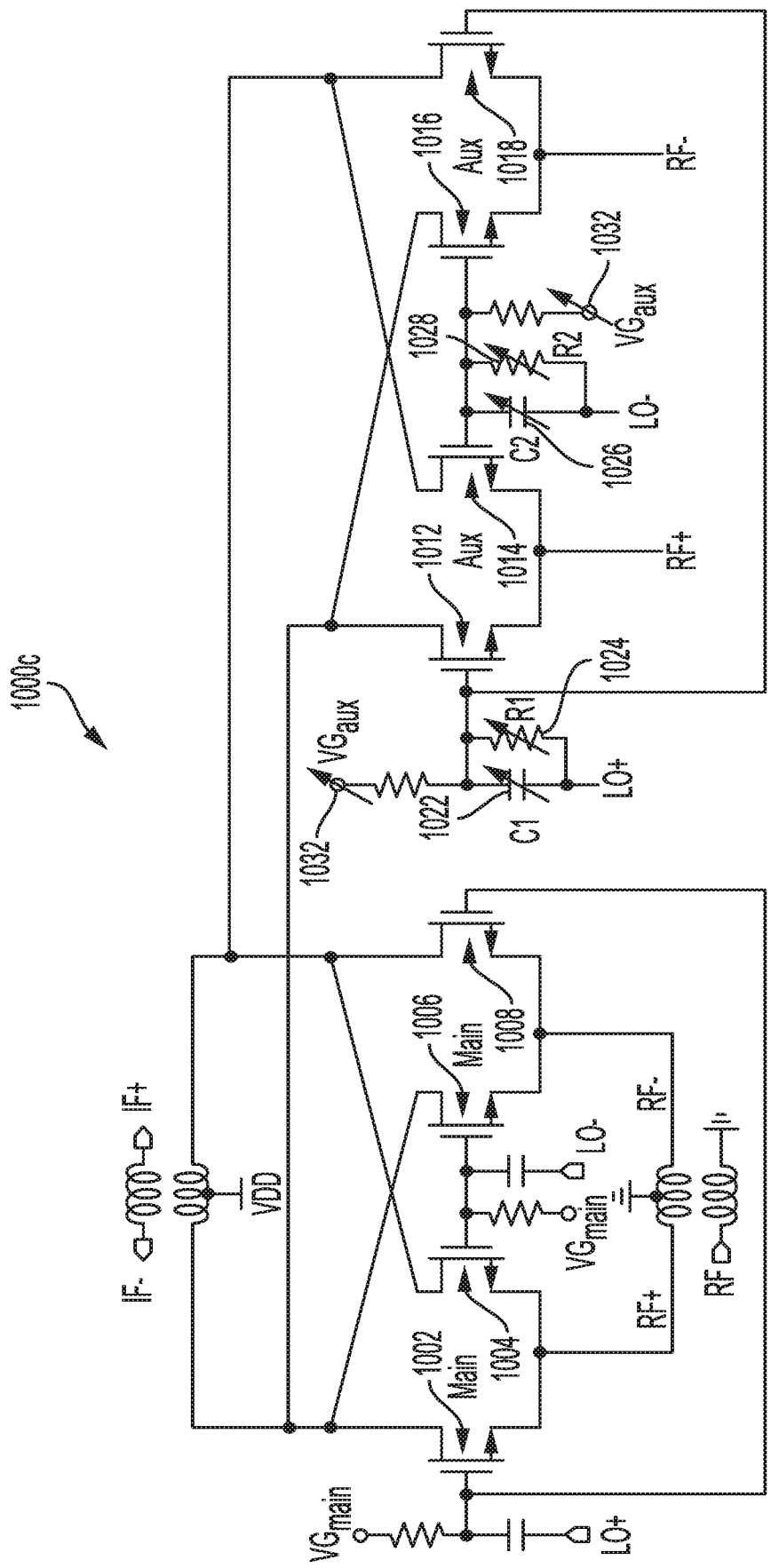
FIG. 10C is a schematic diagram of another example of an active mixer circuit based on a double balanced mixer design that incorporates aspects of the mixer circuits described with reference to FIGS. 6 and 8B.

FIG. 10C is a schematic diagram of another example of an active mixer circuit 1000c based on a double balanced mixer design that incorporates aspects of the mixer circuits described with reference to FIGS. 6 and 8B. Particularly, each of the gate terminals of the auxiliary transistors 1012, 1014, 1016, and 1018 are further electrically coupled to adjustable reactive elements and adjustable resistive elements to adjust the gm3 characteristics as described with reference to FIGS. 6 and 8B. The first auxiliary transistor 1012 and the fourth auxiliary transistor 1018 have gate terminals that are each electrically coupled to an auxiliary bias voltage 1032 as well as to an adjustable capacitor C1 1022 and adjustable resistor R1 1024. The adjustable capacitor C1 1022 and the adjustable resistor R1 1024 are each electrically coupled to one of the differential LO signals and in parallel to one another. The second auxiliary transistor 1014 and the third auxiliary transistor 1016 have gate terminals that are each electrically coupled to an auxiliary bias voltage 1032 as well as to an adjustable capacitor C2 1026 and adjustable resistor R2 1028. The adjustable capacitor C2 1026 and the adjustable resistor R2 1028 are each electrically coupled to the other differential LO signal and in parallel to one another. The mixer circuit 1000c is configured adjust values for the adjustable capacitor C1 1022, adjustable resistor R1 1024, adjustable capacitor C2 1026, and adjustable resistor R2 1028 to adjust the bias of the auxiliary transistors 1012, 1014, 1016, and 1018. The amount of adjustment is selected to better map correlated gm3 values across values Vg of the LO amplitude variation range to improve gm3 cancellation of the main transistors 1002, 1004, 1006, and 1008.

While shown as implemented with NMOS transistors, each of the mixer circuits described with reference to FIGS. 10A, 10B, and 10C may alternatively be implemented with PMOS transistors (or other types of transistors). This applies to any of the mixer circuits described herein.

Figure 11A:
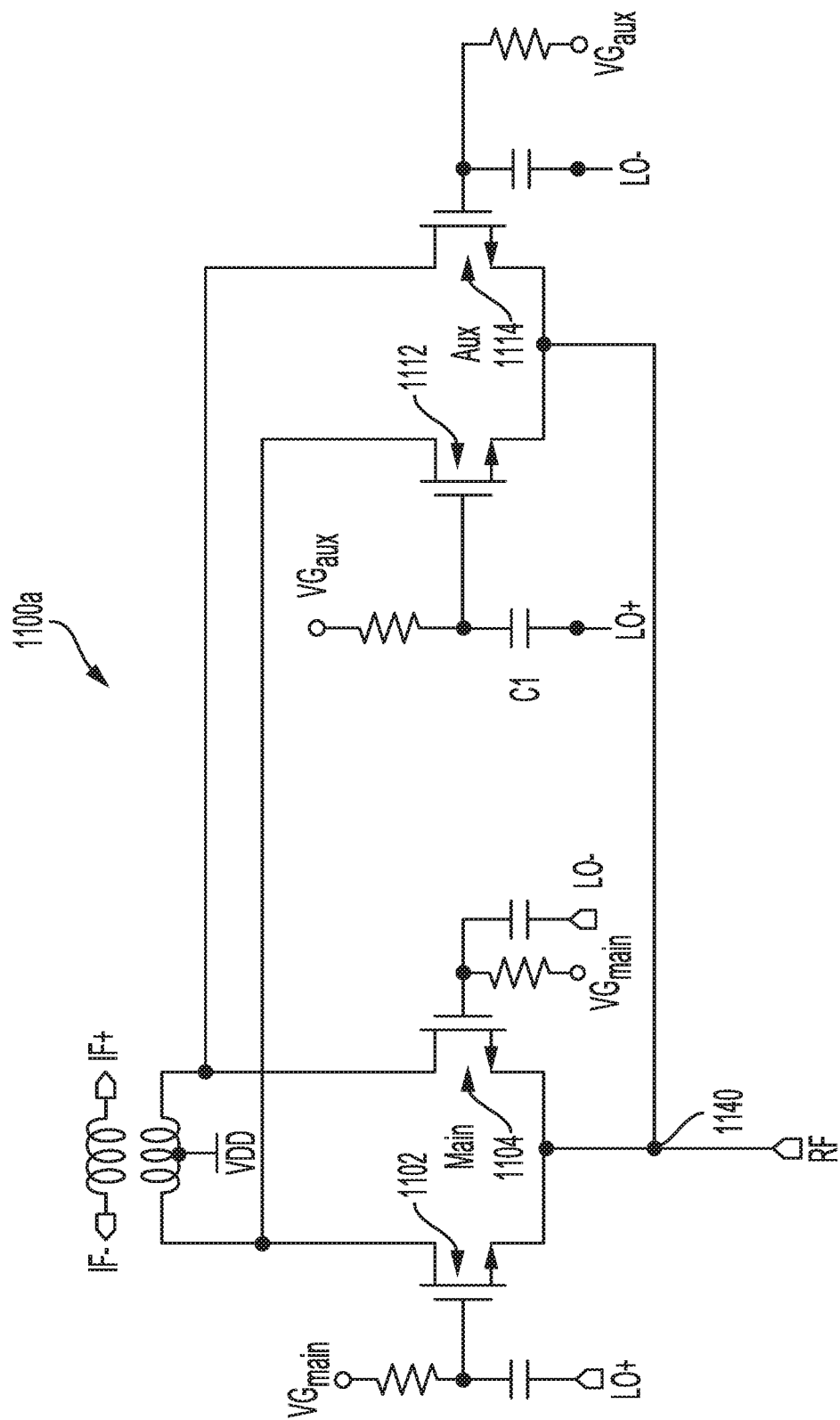
FIG. 11A is a schematic diagram of another example of an active mixer circuit based on a single balanced mixer design incorporating aspects of the gm3 cancellation mixer circuit of FIG. 8A.

FIG. 11A is a schematic diagram of another example of an active mixer circuit 1100a based on a single balanced mixer design incorporating aspects of the gm3 cancellation mixer circuit 800a of FIG. 8A. The first main transistor 1102 is in parallel with a first auxiliary transistor 1112 that is biased as described with reference to FIGS. 4 and 8A to provide gm3 cancellation for the first main transistor 1102. Each of the gate terminals of the first main transistor 1102 and the first auxiliary transistor 1112 are controlled by a first differential LO signal (LO+). Likewise, the second main transistor 1104 is in parallel with a second auxiliary transistor 1114 that is biased as described with reference to FIGS. 4 and 8A to provide gm3 cancellation for the second main transistor 1104. Each of the gate terminals of the second main transistor 1104 and the second auxiliary transistor 1114 are controlled by a second differential LO signal (LO−). Each of the source terminals of the transistors 1102, 1104, 1112, and 1114 are electrically coupled to an RF signal input at node 1140.

Figure 11B:
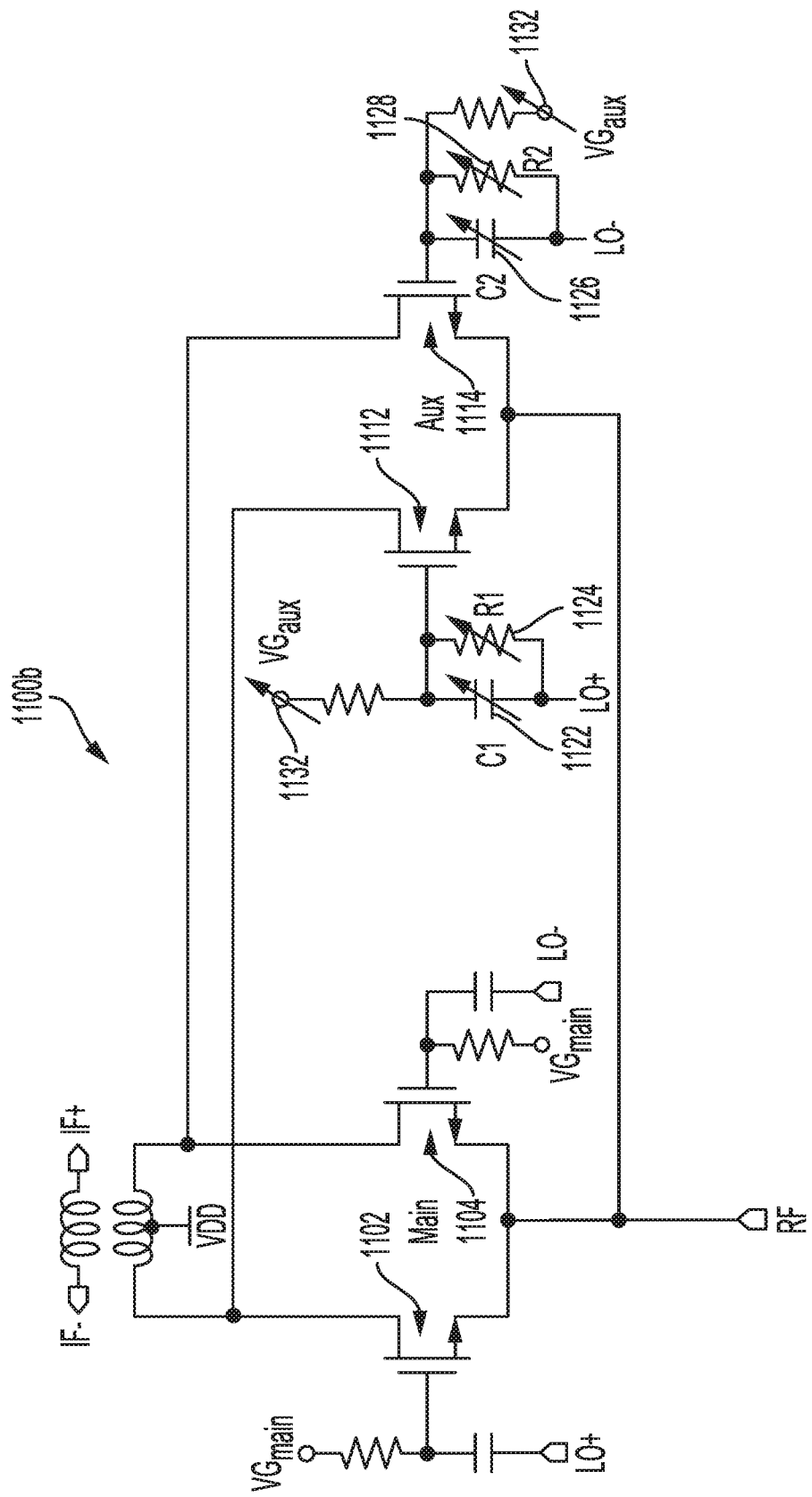
FIG. 11B is a schematic diagram of another example of an active mixer circuit based on a single balanced mixer design that incorporates aspects of the mixer circuits described with reference to FIGS. 6 and 8B.

FIG. 11B is a schematic diagram of another example of an active mixer circuit 1100b based on a single balanced mixer design that incorporates aspects of the mixer circuits described with reference to FIGS. 6 and 8B. Particularly, each of the gate terminals of the auxiliary transistors 1112 and 1114 are further connected to adjustable reactive and resistive elements to adjust the gm3 characteristics as described with reference to FIGS. 6 and 8B. The first auxiliary transistor 1112 has a gate terminal that is electrically coupled to an auxiliary bias voltage 1132 as well as to an adjustable capacitor C1 1122 and adjustable resistor R1 1124. The adjustable capacitor C1 1122 and the adjustable resistor R1 1124 are each electrically coupled to one of the differential LO signals and in parallel to one another. The second auxiliary transistor 1114 has a gate terminal that is electrically coupled to an auxiliary bias voltage 1132 as well as to an adjustable capacitor C2 1126 and adjustable resistor R2 1128. The adjustable capacitor C2 1126 and the adjustable resistor R2 1128 are each electrically coupled to the other differential LO signal and in parallel to one another. The mixer circuit 1100b is configured adjust values for the adjustable capacitor C1 1122, adjustable resistor R1 1124, adjustable capacitor C2 1126, and adjustable resistor R2 1128 to adjust the bias of the auxiliary transistors 1112 and 1114. The amount of adjustment is selected to better map correlated gm3 values across values Vg of the LO amplitude variation range to improve gm3 cancellation of the main transistors 1102 and 1104.

In general, the gm3 cancellation mixer circuit 800a shown in FIGS. 4 and 8A may form a portion of at least one of a double balanced mixer circuit or a single balanced mixer circuit. Even more generally, a mixer circuit contemplated herein may be any form of balanced mixer circuit or unbalanced mixer circuit that include a plurality of mixing circuits or elements where each the plurality of mixing circuits or elements includes a corresponding one of the first mixer circuit and the second mixer circuit described with reference to FIG. 4.

Figure 12:
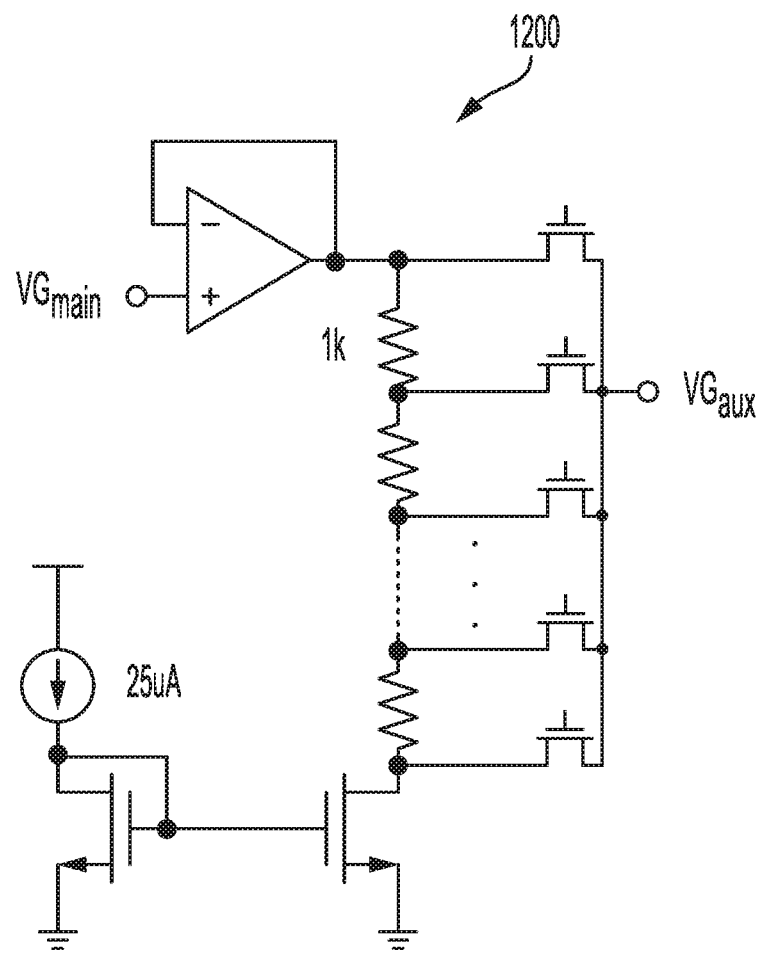
FIG. 12 is an example of a bias voltage circuit configured to generate an auxiliary bias voltage for the mixer circuits described with reference to FIGS. 4-11.

FIG. 12 is an example of a bias voltage circuit 1200 configured to generate an auxiliary bias voltage for the mixer circuits described with reference to FIGS. 4-11. The bias voltage circuit 1200 is configured to generate a bias voltage at an offset from the main bias voltage. The bias voltage circuit 1200 takes an input of the main bias voltage ($VG_{main}$) as a reference for generating the bias at a fixed offset. In some implementations, the bias voltage circuit 1200 may be configured to output one of several different auxiliary bias voltages based on an operational characteristic (e.g., current frequency band, etc.). As such there may be an ability to tune the auxiliary bias voltage. In other implementations (e.g., excluding some of the resistors and or parallel switches) the bias voltage circuit 1200 is configured to generate a single auxiliary bias voltage output that is based on the main bias voltage input. Other bias voltage circuits may also be used to generate the auxiliary bias voltages described above with reference to FIGS. 4-11.

Figure 13:
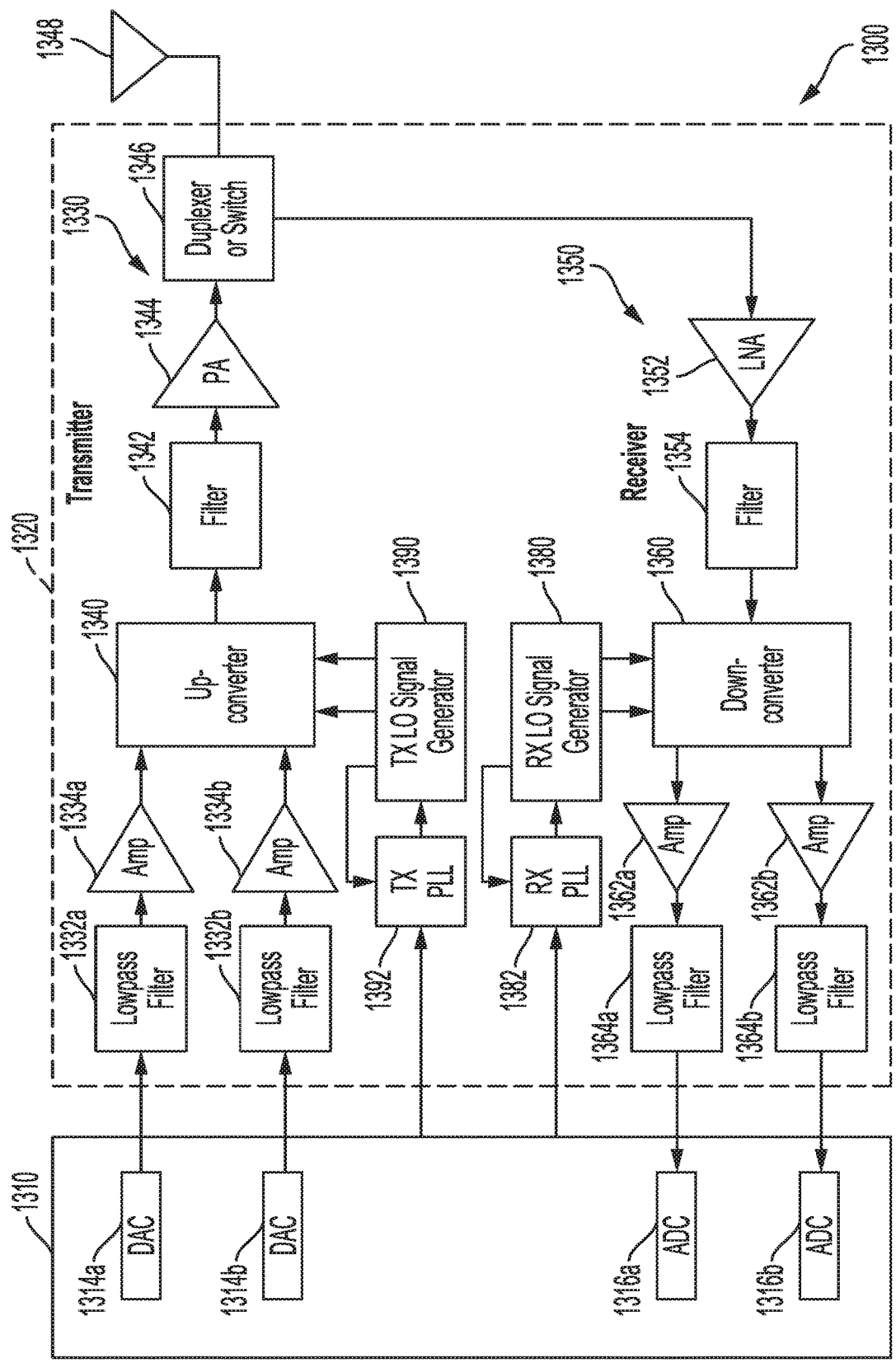
FIG. 13 illustrates an example block diagram of a wireless communication device that may incorporate the mixer circuits described with reference to FIGS. 4-11.

FIG. 13 illustrates an example block diagram of a wireless communication device 1300 that may incorporate the mixer circuits described with reference to FIGS. 4-11. In general, signals in a transmitter and a receiver may be generated and conditioned by one or more stages of amplifier, filter, upconverter, downconverter, etc. These circuit blocks may be arranged differently from the configuration shown in FIG. 13. Furthermore, other circuit blocks not shown in FIG. 13 may also be used to generate and condition the signals in the transmitter and receiver. Some circuit blocks in FIG. 13 may also be omitted.

In the design shown in FIG. 13, wireless device 1300 includes a transceiver 1320 and a data processor 1310. The data processor 1310 may include a memory (not shown) to store data and program codes. Memory, which may include both read-only memory (ROM) and random-access memory (RAM), provides instructions and data to the data processor 1310. A portion of the memory may also include non-volatile random-access memory (NVRAM). The data processor typically performs logical and arithmetic operations based on program instructions stored within the memory. The instructions in the memory may be executable to implement the methods described herein.

Transceiver 1320 includes a transmitter 1330 and a receiver 1350 that support bi-directional communication. In general, wireless device 1300 may include any number of transmitters and any number of receivers for any number of communication systems and frequency bands. All or a portion of transceiver 1320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 13, transmitter 1330 and receiver 1350 are implemented with the direct-conversion architecture.

In the transmit path, data processor 1310 processes data to be transmitted and provides I and Q analog output signals to transmitter 1330. In the exemplary embodiment shown, the data processor 1310 includes digital-to-analog-converters (DAC's) 1314a and 1314b for converting digital signals generated by the data processor 1310 into the I and Q analog output signals, e.g., I and Q output currents, for further processing.

Within transmitter 1330, lowpass filters 1332a and 1332b filter the I and Q analog output signals, respectively, to remove undesired images caused by the prior digital-to-analog conversion. Amplifiers (Amp) 1334a and 1334b amplify the signals from lowpass filters 1332a and 1332b, respectively, and provide I and Q baseband signals. An upconverter 1340 may include the mixer circuit 400 of FIG. 4 (e.g., implemented by the mixer circuits 1000a, 1000b, or 1000c of FIG. 10A, 10B, or 10C). The upconverter 1340 may upconvert the I and Q baseband signals with I and Q transmit (TX) local oscillating (LO) signals from a TX LO signal generator 1390 and provides an upconverted signal. A filter 1342 filters the upconverted signal to remove undesired images caused by the frequency up conversion as well as noise in a receive frequency band. A power amplifier (PA) 1344 amplifies the signal from filter 1342 to obtain the desired output power level and provides a transmit RF signal. The transmit RF signal is routed through a duplexer or switch 1346 and transmitted via an antenna 1348.

In the receive path, antenna 1348 receives signals transmitted by base stations and provides a received RF signal, which is routed through duplexer or switch 1346 and provided to a low noise amplifier (LNA) 1352. The received RF signal is amplified by LNA 1352 and filtered by a filter 1354 to obtain a desirable RF input signal. A downconverter 1360 may include the mixer circuit 400 of FIG. 4 (e.g., implemented by the mixer circuits 1000a, 1000b, or 1000c of FIG. 10A, 10B, or 10C). The downconverter 1360 may down convert the RF input signal with I and Q receive (RX) LO signals from an RX LO signal generator 1380 and provide I and Q baseband signals. The I and Q baseband signals are amplified by amplifiers 1362a and 1362b and further filtered by lowpass filters 1364a and 1364b to obtain I and Q analog input signals, which are provided to data processor 1310. In the exemplary embodiment shown, the data processor 1310 includes analog-to-digital-converters (ADC's) 1316a and 1316b for converting the analog input signals into digital signals to be further processed by the data processor.

TX LO signal generator 1390 generates the I and Q TX LO signals used for frequency up conversion. RX LO signal generator 1380 generates the I and Q RX LO signals used for frequency down conversion. Each LO signal is a periodic signal with a particular fundamental frequency. A PLL 1392 receives timing information from data processor 1310 and generates a control signal used to adjust the frequency and/or phase of the TX LO signals from LO signal generator

1390. Similarly, a PLL 1382 receives timing information from data processor 1310 and generates a control signal used to adjust the frequency and/or phase of the RX LO signals from LO signal generator 1380.

Figure 14:
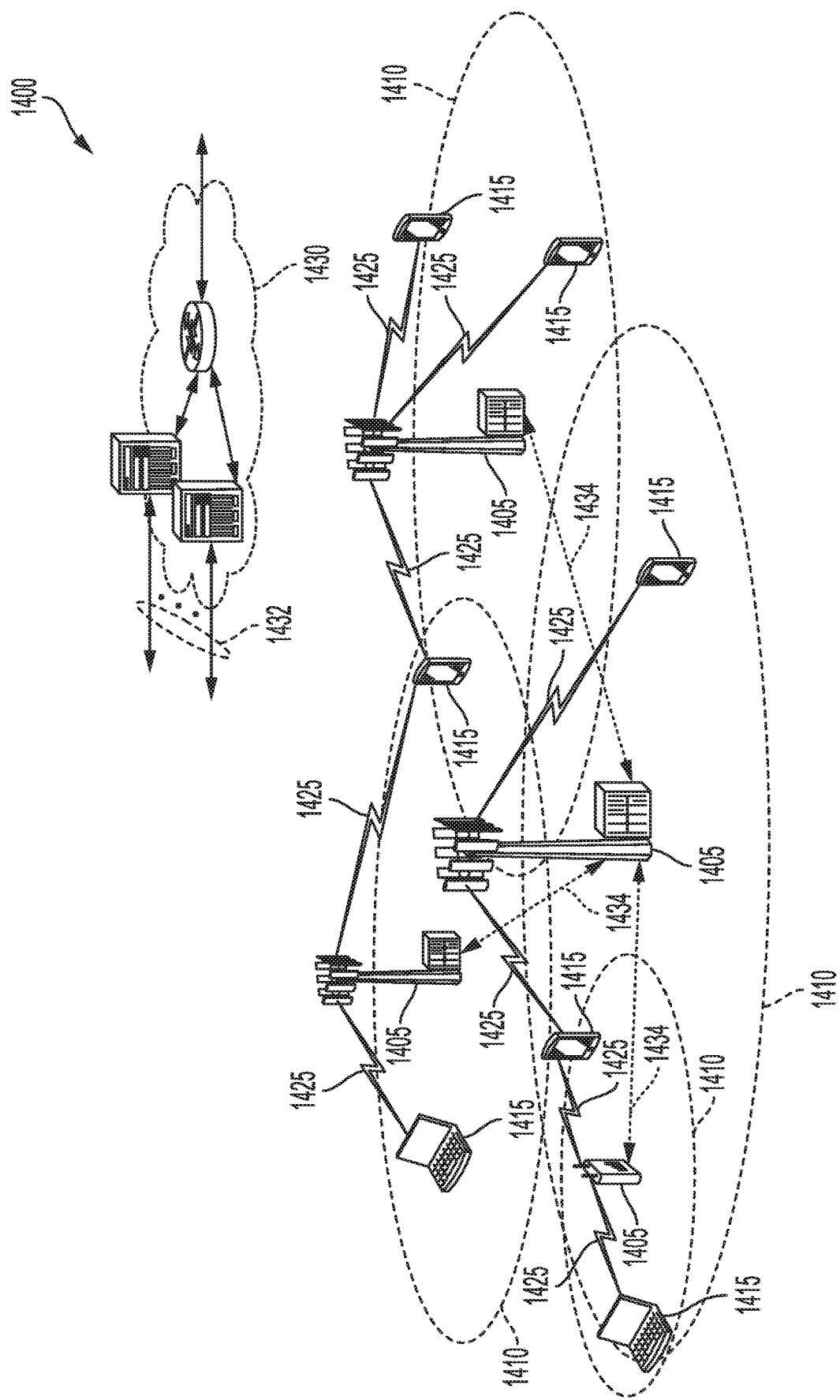
FIG. 14 illustrates an example of a wireless communications system that may include devices that incorporate the mixer circuitry described above.

FIG. 14 illustrates an example of a wireless communications system 1400 that may include devices that incorporate the mixer circuitry described above. The wireless communications system 1400 includes base stations 1405, UEs 1415, and a core network 1430. In some examples, the wireless communications system 1400 may be a LTE (or LTE-Advanced) network, or a New Radio (NR) network. In some cases, wireless communications system 1400 may support enhanced broadband communications, ultra-reliable (i.e., mission critical) communications, low latency communications, and communications with low-cost and low-complexity devices. The base stations 1405, UEs 1415, or both, as well as other devices that communicate wirelessly, each may include one or more active mixers such as those described with reference to FIGS. 4-12.

Base stations 1405 may wirelessly communicate with UEs 1415 via one or more base station antennas. Each base station 1405 may provide communication coverage for a respective geographic coverage area 1410. Communication links 1425 shown in wireless communications system 1400 may include uplink (UL) transmissions from a UE 1415 to a base station 1405, or downlink (DL) transmissions, from a base station 1405 to a UE 1415. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 1415 may be dispersed throughout the wireless communications system 1400, and each UE 1415 may be stationary or mobile. A UE 1415 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 1415 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 1415 may also be able to communicate directly with other UEs (e.g., using a peer-to-peer (P2P) or device-to-device (D2D) protocol). One or more of a group of UEs 1415 utilizing D2D communications may be within the coverage area 1410 of a cell. Other UEs 1415 in such a group may be outside the coverage area 1410 of a cell, or otherwise unable to receive transmissions from a base station 1405. In some cases, groups of UEs 1415 communicating via D2D communications may utilize a one-to-many (1:M) system in which each UE 1415 transmits to every other UE 1415 in the group. In some cases, a base station 1405 facilitates the scheduling of resources for D2D communications. In other cases, D2D communications are carried out independent of a base station 1405.

Wireless communications system 1400 may operate in an ultra-high frequency (UHF) frequency region using frequency bands from 700 MHz to 2600 MHz (2.6 GHz), although in some cases WLAN networks may use frequencies as high as 4 GHz. This region may also be known as the decimeter band, since the wavelengths range from approximately one decimeter to one meter in length. UHF waves may propagate mainly by line of sight and may be blocked by buildings and environmental features. However, the waves may penetrate walls sufficiently to provide service to UEs 1415 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 1400 may also utilize extremely high frequency (EHF) portions of the spectrum (e.g., from around 28 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 1415 (e.g., for directional beamforming). However, EHF transmissions may be subject to even greater atmospheric attenuation and shorter range than UHF transmissions.

Thus, wireless communications system 1400 may support millimeter wave (mm-wave) communications between UEs 1415 and base stations 1405. Devices operating in mm-wave or EHF bands may have multiple antennas to allow beamforming. That is, a base station 1405 may use multiple antennas or antenna arrays to conduct beamforming operations for directional communications with a UE 1415. Beamforming (which may also be referred to as spatial filtering or directional transmission) is a signal processing technique that may be used at a transmitter (e.g. a base station 1405) to shape and/or steer an overall antenna beam in the direction of a target receiver (e.g. a UE 1415). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g. a base station) and a receiver (e.g. a UE), where both transmitter and receiver are equipped with multiple antennas. Some portions of wireless communications system 1400 may use beamforming. For example, base station 1405 may have an antenna array with a number of rows and columns of antenna ports that the base station 1405 may use for beamforming in its communication with UE 1415. Signals may be transmitted multiple times in different directions (e.g., each transmission may be beamformed differently). A mm-wave receiver (e.g., a UE 1415) may try multiple beams (e.g., antenna subarrays) while receiving the synchronization signals.

In some cases, the antennas of a base station 1405 or UE 1415 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 1405 may be located in diverse geographic locations. A base station 1405 may multiple use antennas or antenna arrays to conduct beamforming operations for directional communications with a UE 1415.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communications, the apparatus comprising:
    a first mixer circuit configured to convert between a radio frequency signal and an intermediate frequency signal based at least in part on a local oscillator signal, the first mixer circuit electrically coupled to:
        a first node that is configured to receive a first bias voltage and a first local oscillator signal that is based on the local oscillator signal;
        a second node that is configured to receive the radio frequency signal or the intermediate frequency signal; and
        a third node that is configured to provide the intermediate frequency signal or the radio frequency signal; and
    a second mixer circuit configured to convert between the radio frequency signal and the intermediate frequency signal based at least in part on the local oscillator signal, the second mixer circuit electrically coupled to:

a fourth node configured to receive a second bias voltage and a second local oscillator signal that is based on the local oscillator signal, the second bias voltage having a voltage level that is offset from the first bias voltage;

the second node that is configured to receive the radio frequency signal or the intermediate frequency signal;

the third node that is configured to provide the intermediate frequency signal or the radio frequency signal;

a first bias circuit configured to generate the first bias voltage; and a second bias circuit configured to generate the second bias voltage.

2. The apparatus of claim 1, wherein the second bias voltage is offset from the first bias voltage by a fixed and pre-determined amount.

3. The apparatus of claim 1, wherein the second bias circuit is configured to dynamically adjust the second bias voltage.

4. The apparatus of claim 1, wherein an amount of the offset between the first bias voltage and the second bias voltage is configured to cause cancellation of a third order transconductance (gm3) of the first mixer circuit over a range of different peak-to-peak amplitudes of the local oscillator signal.

5. The apparatus of claim 1, further comprising a local oscillator configured to vary a frequency of the local oscillator signal during operation that causes variation of a peak-to-peak amplitude of the local oscillator signal based on the frequency.

6. The apparatus of claim 1, wherein third order transconductance (gm3) values of the first mixer circuit over a range of variation in an amplitude of the local oscillator signal are at least partially cancelled by gm3 values of the second mixer circuit over the range of variation in the amplitude of the local oscillator signal.

7. The apparatus of claim 1, further comprising a reactive element and a resistive element each electrically coupled to the fourth node, the reactive element electrically connected in parallel to the resistive element.

8. The apparatus of claim 7, wherein a reactance of the reactive element and resistance of the resistive element have values that are configured to adjust gm3 values of the second mixer circuit to values that provide gm3 cancellation of gm3 of the first mixer circuit.

9. The apparatus of claim 7, wherein the reactive element is an adjustable reactive element and the resistive element is an adjustable resistive element.

10. The apparatus of claim 1, wherein one or more components of the first bias circuit and the second bias circuit are shared.

11. The apparatus of claim 1, wherein each of the first and second mixer circuits are active mixer circuits and are each electrically coupled to one or more supply voltages.

12. The apparatus of claim 1, wherein the first mixer circuit comprises a first transistor having:

a first source terminal electrically coupled to the second node;

a first drain terminal electrically coupled to the third node; and a first gate terminal electrically coupled to the first node, wherein the second mixer circuit comprises a second transistor having:

a second source terminal electrically coupled to the second node;

a second drain terminal electrically coupled to the third node; and a second gate terminal electrically coupled to the fourth node.

13. The apparatus of claim 12, wherein at least one of:
the third node is electrically coupled to a supply voltage; or
the second node is electrically coupled to a supply voltage.

14. The apparatus of claim 12, wherein the second bias voltage biases the second transistor in a sub-threshold region.

15. The apparatus of claim 12, further comprising one or more adjustable reactive or resistive elements electrically coupled to the fourth node.

16. The apparatus of claim 12, wherein the first transistor and the second transistor form a portion of at least one of a double balanced mixer circuit or a single balanced mixer circuit.

17. The apparatus of claim 12, wherein the radio frequency signal is formed from a differential radio frequency signal having a positive signal and a negative signal, wherein the apparatus comprises a transformer configured to receive or provide the positive signal at a first differential node and receive or provide the negative signal at a second differential node, wherein the local oscillator signal is formed from a differential local oscillator signal, wherein the intermediate frequency signal is formed from a differential intermediate frequency signal, wherein the apparatus further comprises a transformer electrically coupled between the third node and a fifth node, the transformer configured to receive or provide the differential intermediate frequency signal, wherein the second node corresponds to the first differential node.

18. The apparatus of claim 1, further comprising a mixer circuit comprising a plurality of mixing circuits, each of the plurality of mixing circuits comprising a corresponding one of the first mixer circuit and the second mixer circuit.

19. The apparatus of claim 1, wherein the intermediate frequency signal corresponds to a baseband signal.

20. The apparatus of claim 1, wherein the first mixer circuit and the second mixer circuit form a portion of a transceiver in a user equipment device.

21. An active mixer circuit comprising:
a first switching device connected in parallel with a second switching device, each of the first switching device and the second switching device controlled by a local oscillator signal, the first switching device configured to be biased by an amount that is non-zero and offset from a bias amount of the second switching device that at least partially cancels a third order transconductance (gm3) of the second switching device.

22. The active mixer circuit of claim 21, further comprising a reactive element and a resistive element each electrically coupled to the second switching device, the reactive element electrically connected in parallel to the resistive element.

23. The active mixer circuit of claim 21, wherein the first switching device and the second switching device form a portion of at least one of a double balanced mixer circuit or a single balanced mixer circuit.

24. A method for converting between a radio frequency signal and an intermediate frequency signal based at least in part on a local oscillator signal, the method including:

applying a first bias voltage and a first local oscillator signal based on the local oscillator signal to a first node electrically coupled to a first mixer circuit, the first mixer circuit having a second node electrically coupled to the radio frequency signal and a third node electrically coupled to the intermediate frequency signal; and applying a second bias voltage and a second local oscillator signal based on the local oscillator signal to a fourth node electrically coupled to a second mixer circuit, the second mixer circuit electrically coupled to the second node and the third node, the second bias voltage having a voltage level that is offset from the first bias voltage wherein third order transconductance (gm3) values of the first mixer circuit over a range of variation in an amplitude of the local oscillator signal are at least partially cancelled by gm3 values of the second mixer circuit over the range of variation in the amplitude of the local oscillator signal.

25. The method of claim 24, further comprising dynamically adjusting the second bias voltage.

26. The method of claim 24, further comprising adjusting values of an adjustable reactive element and an adjustable resistive element each electrically coupled to the fourth node.

27. An apparatus for wireless communications, the apparatus comprising:
first means for converting between a radio frequency signal and an intermediate frequency signal based at least in part on a local oscillator signal, the first converting means electrically coupled to:
a first node that is configured to receive a first bias voltage and a first local oscillator signal that is based on the local oscillator signal;
a second node that is configured to receive the radio frequency signal or the intermediate frequency signal; and
a third node that is configured to provide the intermediate frequency signal or the radio frequency signal; and
second means for converting between the radio frequency signal and the intermediate frequency signal based at least in part on the local oscillator signal, the second converting means electrically coupled to:
a fourth node configured to receive a second bias voltage and a second local oscillator signal that is based on the local oscillator signal, the second bias voltage having a voltage level that is offset from the first bias voltage;
the second node that is configured to receive the radio frequency signal or the intermediate frequency signal; and
the third node that is configured to provide the intermediate frequency signal or the radio frequency signal, wherein third order transconductance (gm3) values of the first converting means over a range of variation in an amplitude of the local oscillator signal are at least partially cancelled by gm3 values of the second converting means over the range of variation in the amplitude of the local oscillator signal.

28. An apparatus for wireless communications, the apparatus comprising:
a mixer circuit comprising a plurality of mixing circuits, each of the plurality of mixing circuits comprising a corresponding one of a first mixer circuit and a second mixer circuit, the first mixer circuit configured to convert between a radio frequency signal and an intermediate frequency signal based at least in part on a local oscillator signal, the first mixer circuit electrically coupled to:
a first node that is configured to receive a first bias voltage and a first local oscillator signal that is based on the local oscillator signal;
a second node that is configured to receive the radio frequency signal or the intermediate frequency signal; and
a third node that is configured to provide the intermediate frequency signal or the radio frequency signal; and
the second mixer circuit configured to convert between the radio frequency signal and the intermediate frequency signal based at least in part on the local oscillator signal, the second mixer circuit electrically coupled to:
a fourth node configured to receive a second bias voltage and a second local oscillator signal that is based on the local oscillator signal, the second bias voltage having a voltage level that is offset from the first bias voltage;
the second node that is configured to receive the radio frequency signal or the intermediate frequency signal; and
the third node that is configured to provide the intermediate frequency signal or the radio frequency signal.

29. The apparatus of claim 28, further comprising a reactive element and a resistive element each electrically coupled to the fourth node, the reactive element electrically connected in parallel to the resistive element.

30. The apparatus of claim 28, wherein an amount of the offset between the first bias voltage and the second bias voltage is configured to cause cancellation of a third order transconductance (gm3) of the first mixer circuit over a range of different peak-to-peak amplitudes of the local oscillator signal.

31. An apparatus for wireless communications, the apparatus comprising:
a first mixer circuit configured to convert between a radio frequency signal and an intermediate frequency signal based at least in part on a local oscillator signal, the first mixer circuit electrically coupled to:
a first node that is configured to receive a first bias voltage and a first local oscillator signal that is based on the local oscillator signal;
a second node that is configured to receive the radio frequency signal or the intermediate frequency signal; and
a third node that is configured to provide the intermediate frequency signal or the radio frequency signal; and
a second mixer circuit configured to convert between the radio frequency signal and the intermediate frequency signal based at least in part on the local oscillator signal, the second mixer circuit electrically coupled to:
a fourth node configured to receive a second bias voltage and a second local oscillator signal that is based on the local oscillator signal, the second bias voltage having a voltage level that is offset from the first bias voltage;
the second node that is configured to receive the radio frequency signal or the intermediate frequency signal;

the third node that is configured to provide the intermediate frequency signal or the radio frequency signal; and a reactive element and a resistive element each electrically coupled to the fourth node, the reactive element electrically connected in parallel to the resistive element.

32. The apparatus of claim 31, wherein an amount of the offset between the first bias voltage and the second bias voltage is configured to cause cancellation of a third order transconductance (gm3) of the first mixer circuit over a range of different peak-to-peak amplitudes of the local oscillator signal.

* * * * *